United States Patent
Chen et al.

(10) Patent No.: US 10,573,649 B2
(45) Date of Patent: Feb. 25, 2020

(54) SEMICONDUCTOR DEVICE AND MANUFACTURING METHOD THEREOF

(71) Applicant: UNITED MICROELECTRONICS CORP., Hsin-Chu (TW)

(72) Inventors: Chien-Hung Chen, Hsinchu County (TW); Shih-Hsien Huang, Kaohsiung (TW); Yu-Ru Yang, Hsinchu County (TW); Chia-Hsun Tseng, Tainan (TW); Cheng-Tzung Tsai, Taipei (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 148 days.

(21) Appl. No.: 15/045,258

(22) Filed: Feb. 17, 2016

(65) Prior Publication Data

US 2017/0200721 A1  Jul. 13, 2017

(30) Foreign Application Priority Data

Jan. 12, 2016 (CN) .......................... 2016 1 0018287

(51) Int. Cl.
*H01L 27/092* (2006.01)
*H01L 29/165* (2006.01)
(Continued)

(52) U.S. Cl.
CPC .. *H01L 27/0928* (2013.01); *H01L 21/823821* (2013.01); *H01L 21/823892* (2013.01);
(Continued)

(58) Field of Classification Search
None
See application file for complete search history.

(56) References Cited

U.S. PATENT DOCUMENTS 9,502,420 B1 * 11/2016 Bedell ............... H01L 29/66795
2014/0151766 A1 * 6/2014 Eneman ............. H01L 29/1054
257/288
(Continued)

OTHER PUBLICATIONS

CRC Semiconcudtor Properties, Berger, LI,, CRC Handbook, 96th edition, 2015-2016, http://www.crchandbook.comllarticles/12_18_92.pdf#xml=http://www.crchandbook.com/search/pdfHits.asp?id=12_18_92&DocId=113879&hitCount=12&hits=5171+4847+4484+4154+3807+3467+3344+2786+2044+1342+679+300+.*

(Continued)

*Primary Examiner* — Davienne N Monbleau
*Assistant Examiner* — Scott R Wilson
(74) *Attorney, Agent, or Firm* — Winston Hsu

(57) ABSTRACT

A semiconductor device includes a substrate, a first well formed in the substrate, a second well formed in the substrate, a first fin formed on the first well, and a second fin formed on the second well. The first well includes a first conductivity type, the second well includes a second conductivity type, and the first conductivity type and the second conductivity type are complementary to each other. The substrate includes a first semiconductor material. The first fin and the second fin include the first semiconductor material and a second semiconductor material. A lattice constant of the second semiconductor material is larger than a lattice constant of the first semiconductor material. The first semiconductor material in the first fin includes a first concentration, the first semiconductor material in the second fin includes a second concentration, and the second concentration is larger than the first concentration.

9 Claims, 20 Drawing Sheets

(51) Int. Cl.
    *H01L 21/8238*    (2006.01)
    *H01L 29/10*      (2006.01)
    *H01L 21/02*      (2006.01)
    *H01L 29/737*     (2006.01)

(52) U.S. Cl.
    CPC ........ *H01L 27/0924* (2013.01); *H01L 29/165* (2013.01); *H01L 21/0245* (2013.01); *H01L 21/02381* (2013.01); *H01L 21/02532* (2013.01); *H01L 29/1054* (2013.01); *H01L 29/7378* (2013.01)

(56) References Cited

U.S. PATENT DOCUMENTS

| | | | | |
|---|---|---|---|---|
| 2014/0167120 A1* | 6/2014 | Chi | ................... | H01L 27/0886 257/288 |
| 2014/0353718 A1* | 12/2014 | Loubet | ................ | H01L 27/092 257/192 |
| 2016/0064288 A1* | 3/2016 | Cheng | .................. | H01L 29/165 257/192 |
| 2016/0104799 A1* | 4/2016 | Qi | ..................... | H01L 29/7849 257/29 |

OTHER PUBLICATIONS

Witters et al., Strained Germanium quantum well pMOS FinFETs fabricated on in situ phosphorus-doped SiGe strain relaxed buffer layers using a replacement Fin process, Dec. 2013.

\* cited by examiner

SEMICONDUCTOR DEVICE AND MANUFACTURING METHOD THEREOF

BACKGROUND OF THE INVENTION

1. Field of the Invention

The present invention relates to a semiconductor device and manufacturing method thereof, and more particularly, to a semiconductor device including fins and manufacturing method thereof.

2. Description of the Prior Art

Epitaxial structures are prevalently used in a wide variety of semiconductor applications. For example, the prior art usually forms an epitaxial layer such as an epitaxial silicon germanium (hereinafter abbreviated as SiGe) layer in a single crystal substrate by performing a selective epitaxial growth (hereinafter abbreviated as SEG) method. Because the lattice constant of the epitaxial SiGe layer is larger than that of the silicon substrate, a strain stress is generated to the meta-oxide semiconductor (hereinafter abbreviated as MOS) transistor device. Accordingly, carrier mobility in the channel region is improved and the speed of the MOS transistor device is increased.

Although the epitaxial structures efficiently improve device performance, it increase complexity of the semiconductor fabrication and difficulties of process control. For example, devices of different conductivity types require different stresses: the p-typed transistor devices require compressive stresses while the n-typed transistor devices require tensile stresses. Therefore, it is getting more and more difficult to design and fabricate semiconductor devices demanding different stresses from the epitaxial structures.

Accordingly, though the epitaxial structures are able to improve the device performance, it is always in need to provide semiconductor devices as expected when the progress of semiconductor manufacturing technology is improved and complexity of the products is increased.

SUMMARY OF THE INVENTION

According to an aspect of the present invention, a semiconductor device is provided. The semiconductor device includes a substrate including a first semiconductor material, a first well formed in the substrate, a second well formed in the substrate, a first fin formed on the first well, and a second fin formed on the second well. The first well includes a first conductivity type and the second well includes a second conductivity type. The first conductivity type and the second conductivity type are complementary to each other. The first fin and the second fin include the first semiconductor material and a second semiconductor material, and a lattice constant of the second semiconductor material is larger than a lattice constant of the first semiconductor material. The first semiconductor material in the first fin includes a first concentration, the first semiconductor material in the second fin includes a second concentration, and the second concentration is larger than the first concentration.

According to an aspect of the present invention, a method for manufacturing fins is provided. The method includes following steps: A substrate including a first semiconductor material is provided. The substrate includes a first well and a second well formed therein. Next, a first patterned epitaxial structure is formed on the first well and a second patterned epitaxial structure is formed on the second well. A dielectric layer is then formed on the substrate, and the dielectric layer surrounds the first patterned epitaxial structure and the second patterned epitaxial structure. Subsequently, an etching process is performed to remove a portion of the first patterned epitaxial structure to form a recess on the first well, and followed by forming an epitaxial semiconductor layer in the recess.

Subsequently, a portion of the dielectric layer is removed to form a first fin on the first well and a second fin on the second well.

According to an aspect of the present invention, another method for manufacturing fins is provided. The method includes following steps: A substrate including a dielectric layer formed thereon is provided. The substrate includes a first semiconductor material, and a first trench and a second trench are formed in the dielectric layer. Next, a first epitaxial structure is formed in the first trench and a second epitaxial structure is formed in the second trench. Subsequently, an etching process is performed to remove a portion of the first epitaxial structure to form a recess, and followed by forming an epitaxial semiconductor layer in the recess. Subsequently, a portion of the dielectric layer is removed to form a first fin and a second fin on the substrate.

According to the semiconductor device and the manufacturing method provided by the present invention, a replacement fin approach is provided: By removing a portion of the first epitaxial structure/the first patterned epitaxial structure and forming different epitaxial structures, the resulted first fin and second fin respectively render the tensile and compressive stresses due to the different materials/concentrations. In other words, different stressors required by transistors including complementary conductivity types are formed by the manufacturing method provided by the present invention. Furthermore, the semiconductor device and the manufacturing method provided by the present invention can be integrated with the STI-first process and the STI-last process. That is, process flexibility and process practicability of the method provided by the present invention are both improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for manufacturing fins provided by a first preferred embodiment of the present invention, wherein FIG. 2 is a schematic drawing illustrating a modification to the method for manufacturing the fins provided the present invention;

FIG. 3 is a schematic drawing in a step subsequent to FIG. 1;

FIG. 4 is a schematic drawing in a step subsequent to FIG. 3;

FIG. 5 is a schematic drawing in a step subsequent to FIG. 4;

FIG. 6 is a schematic drawing in a step subsequent to FIG. 5;

FIG. 7 is a schematic drawing in a step subsequent to FIG. 6; and

FIG. 8 is a schematic drawing in a step subsequent to FIG. 7.

FIGS. 9-10 are schematic drawings illustrating a method for manufacturing fins provided by a second preferred embodiment of the present invention, wherein FIG. 10 is a schematic drawing in a step subsequent to FIG. 9.

FIGS. 11-16 are schematic drawings illustrating a method for manufacturing fins provided by a third preferred embodiment of the present invention, wherein FIG. 12 is a schematic drawing in a step subsequent to FIG. 11;

FIG. 13 is a schematic drawing in a step subsequent to FIG. 12;

FIG. 14 is a schematic drawing in a step subsequent to FIG. 13;

FIG. 15 is a schematic drawing in a step subsequent to FIG. 14; and

FIG. 16 is a schematic drawing in a step subsequent to FIG. 15.

FIGS. 17-20 are schematic drawings illustrating a method for manufacturing fins provided by a fourth preferred embodiment of the present invention, wherein FIG. 18 is a schematic drawing in a step subsequent to FIG. 17;

FIG. 19 is a schematic drawing in a step subsequent to FIG. 18;

FIG. 20 is a schematic drawing in a step subsequent to FIG. 19.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention maybe practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
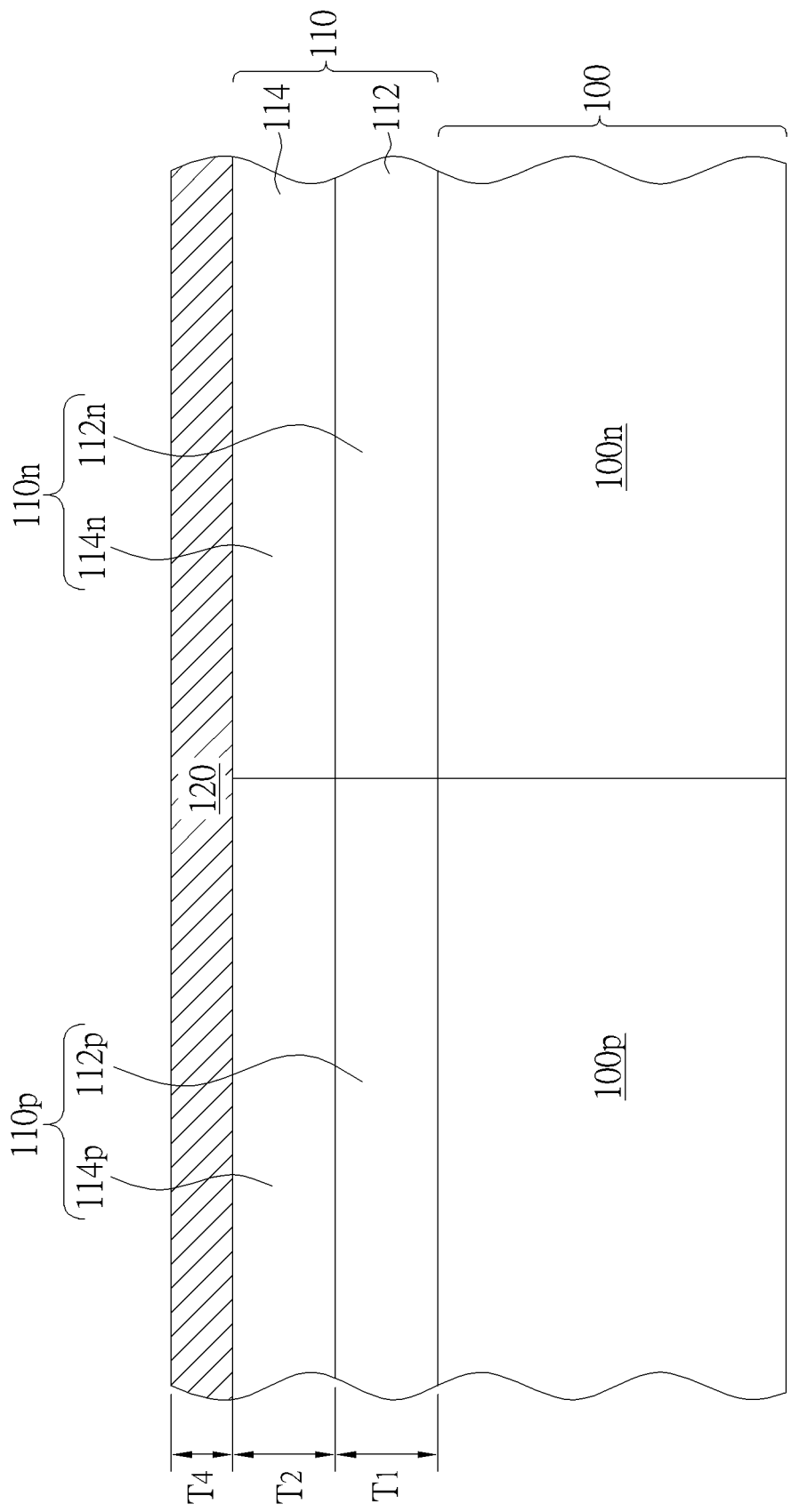

Please refer to FIGS. 1-8 which are schematic drawings illustrating a method for manufacturing fins provided by a first preferred embodiment of the present invention. As shown in FIG. 1, a substrate 100 is provided. The substrate 100 includes a first semiconductor material, and the first semiconductor material may be, for example but not limited to, silicon (Si), germanium (Ge), III-V compound, or II-VI compound. In some embodiments the first semiconductor material preferably includes Si, but not limited to this. Additionally, the semiconductor substrate 100 can be a bulk Si substrate in the preferred embodiment. Alternatively, the substrate 100 can be a semiconductor on insulator (SOI) substrate in other embodiments of the present invention. Next, an ion implantation is performed to implant n-typed dopants such as phosphorous (P) into a portion of the substrate 100, and an ion implantation is performed to implant p-typed dopants such as boron (B) into another portion of the substrate 100. Subsequently, a suitable thermal treatment known in the art is performed to form an n-well 100n and a p-well 100p in the substrate 100 as shown in FIG. 1. In some embodiments of the present invention, B concentration can be $5E17/cm^3$ while P concentration can be $5E17/cm^3$, but it should be easily understood that dopant choices and dopant concentrations are not limited to this.

Please still refer to FIG. 1. Next, a lower epitaxial layer 112 is formed on the substrate 100. The lower epitaxial layer 112 can be formed by performing a SEG method, but not limited to this. The lower epitaxial layer 112 includes a thickness $T_1$, and the thickness $T_1$ can be approximately 100 nanometers (nm), but not limited to this. The lower epitaxial layer 112 includes the abovementioned first semiconductor material and a second semiconductor material, and a lattice constant of the second semiconductor material is different from a lattice constant of the first semiconductor material. In accordance with the preferred embodiment, the lattice constant of the second semiconductor material is larger than the lattice constant of the first semiconductor material. For example, the second semiconductor material provided by the preferred embodiment is Ge, but not limited to this. Accordingly, the lower epitaxial layer 112 is a SiGe epitaxial layer. A concentration of the second semiconductor material in the lower epitaxial layer 112 can be approximately 20%, but not limited to this. More important, an n-typed ion implantation and a p-typed ion implantation are performed after forming the lower epitaxial layer 112. Thus, n-typed dopants such as P are implanted into the lower epitaxial layer 112 on the n-well 100n, and p-typed dopants such as B are implanted into the lower epitaxial layer 112 on the p-well 100p. And a suitable thermal treatment known in the art is performed thereafter. Consequently, an n-typed lower epitaxial layer 112n is formed on the n-well 100n and a p-typed lower epitaxial layer 112p is formed on the p-well 100p. As shown in FIG. 1, in some embodiments of the present invention, P concentration can be $1E18/cm^3$ and B concentration can be $1E18/cm^3$, however it is well-known to those skilled in the art that the choices and concentrations of the n/p-typed dopants are not limited to this.

Please refer to FIG. 1 again. After forming the n-typed lower epitaxial layer 112n and the p-typed lower epitaxial layer 112p, another SEG method is performed and an upper epitaxial layer 114 is formed on the n-typed lower epitaxial layer 112n and the p-typed lower epitaxial layer 112p. The upper epitaxial layer 114 includes a thickness $T_2$, and the thickness $T_2$ can be approximately 100 nm, but not limited to this. The upper epitaxial layer 114 includes the first semiconductor material and the second semiconductor material, thus the upper epitaxial layer 114 also is a SiGe epitaxial layer. It is noteworthy that a concentration of the second semiconductor material in the upper epitaxial layer 114 is larger than the concentration of the second semiconductor material in the lower epitaxial layer 112. For example but not limited to, the concentration of the second semiconductor material in the upper epitaxial layer 114 can be approximately 40%. After forming the upper epitaxial layer 114, an n-typed ion implantation and a p-typed ion implantation are performed. Thus, n-typed dopants such as P are implanted into the upper epitaxial layer 114 on the n-well 100n, and p-typed dopants such as B are implanted into the upper epitaxial layer 114 on the p-well 100p. And a suitable thermal treatment known in the art is subsequently performed. Consequently, an n-typed upper epitaxial layer 114n is formed on the n-well 100n and the n-typed lower epitaxial layer 112n, and a p-typed upper epitaxial layer 114p is formed on the p-well 100p and the p-typed lower epitaxial layer 112p. As shown in FIG. 1, in some embodiments of the present invention, P concentration can be $3E18/cm^3$ while B concentration can be $3E18/cm^3$. However, as mentioned afore, it is well-known to those skilled in the art that the choices and concentrations of the n/p-typed dopants are not limited to this.

Please still refer to FIG. 1. According to the preferred embodiment, the lower epitaxial layer 112 and the upper epitaxial layer 114 construct an epitaxial semiconductor layer 110. In detail, the n-typed lower epitaxial layer 112n and the n-typed upper epitaxial layer 114n construct an n-typed epitaxial semiconductor layer 110n while the p-typed lower epitaxial layer 112p and the p-typed upper epitaxial layer 114p construct a p-typed epitaxial semiconductor layer 110p. As shown in FIG. 1, the epitaxial semiconductor layer 110 is a multiple layer with upwardly increased Ge concentration and upwardly increased n/p-typed dopant concentrations. However, it is well-known to those skilled in the art that the concentrations of the second semiconductor material in the lower epitaxial layer 112 and the upper epitaxial layer 114 are not limited to this. Those concentrations can be adjusted depending on different process and/or product requirements as long as the concentration of the second semiconductor material in the lower epitaxial layer 112 is smaller than the concentration of the second semiconductor material in the upper epitaxial layer 114. Furthermore, in some embodiments of the present invention, at least a middle epitaxial layer (not shown) can be formed in between the upper epitaxial layer 114 and the lower epitaxial layer 112. The middle epitaxial layer(s) also includes the first semiconductor material and the second semiconductor material, and a concentration of the second semiconductor material in the middle epitaxial layer(s) is between the concentrations of the second semiconductor material in the upper and lower epitaxial layers 114/112. In other words, in the embodiments of the present invention, the epitaxial semiconductor layer 110 includes a multiple layer with the Ge concentration upwardly increased. For example but not limited to, the Ge concentration in the epitaxial semiconductor layer 110 is upwardly increased or graded from 0% to 50% while the concentrations of the n/p-typed dopants are also upwardly increased or graded.

Figure 2:
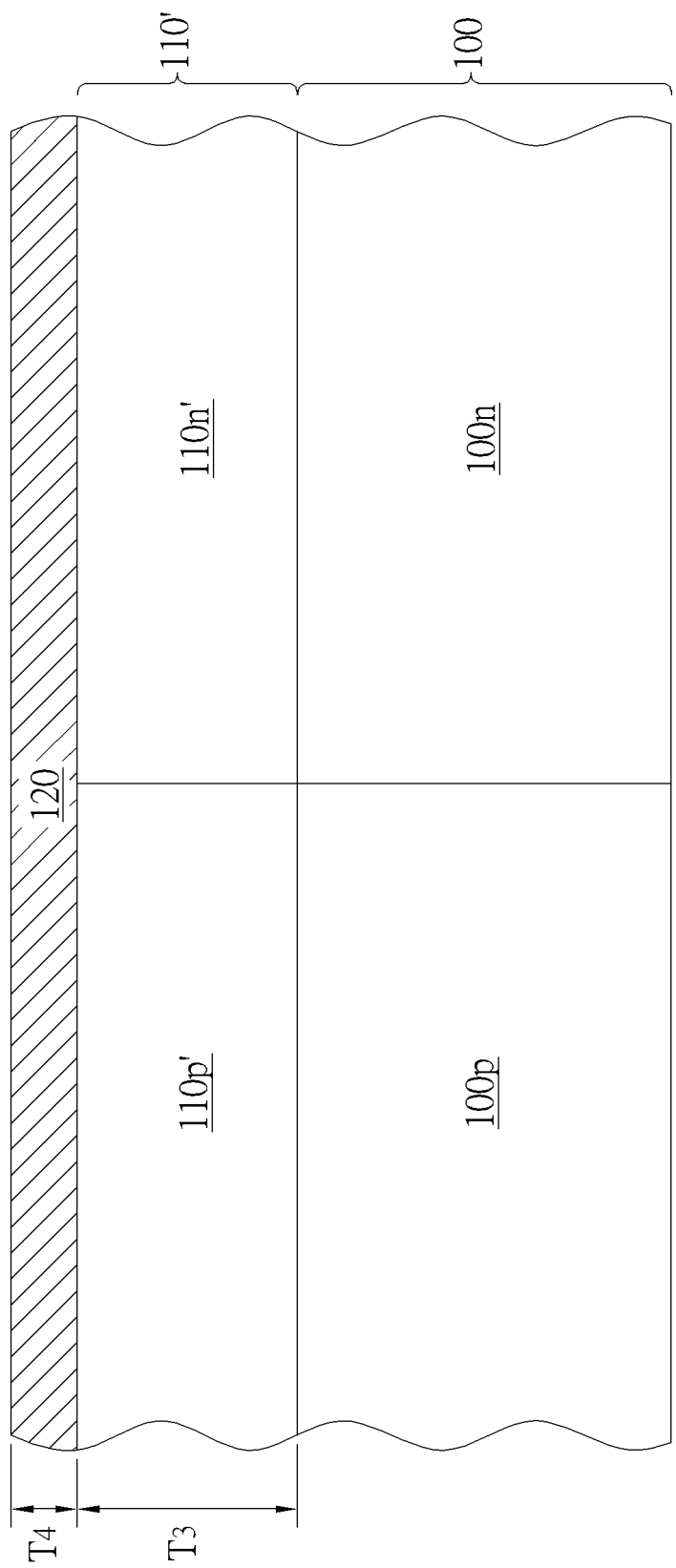

Please refer to FIG. 2, which is a schematic drawing illustrating a modification to the method for manufacturing fins provided by the present invention. According to the modification, an epitaxial semiconductor layer 110' is formed by performing a SEG method and the epitaxial semiconductor layer 110' is a single layer. A Ge concentration in the epitaxial semiconductor layer 110' can be fixed to 30%. However, it should be easily realized that the Ge concentration can be modified according to different product requirements. The single-layered epitaxial semiconductor layer 110' includes a thickness $T_3$, and the thickness $T_3$ can be 200 nm, but not limited to this. As mentioned above, an n-typed ion implantation and a p-typed ion implantation are performed after forming the epitaxial semiconductor layer 110'. Thus, n-typed dopants such as P are implanted into the epitaxial semiconductor layer 110' on the n-well 100n and p-typed dopants such as B are implanted into the epitaxial semiconductor layer 110' on the p-well 100p. In some embodiments of the present invention, P concentration is $3E18/cm^3$ while B concentration is $3E18/cm^3$. However, as mentioned afore, it is well-known to those skilled in the art that the choices and concentrations of the n/p-typed dopants are not limited to this. Then, a suitable thermal treatment known in the art is performed. Consequently, an n-typed epitaxial semiconductor layer 110n' is formed on the n-well 100n and a p-typed epitaxial semiconductor layer 110p' is formed on the p-well 100p.

Please refer to FIGS. 1 and 2. After forming the epitaxial semiconductor layer 110/110' including the first semiconductor material and the second semiconductor material, another epitaxial semiconductor layer 120 is formed. The epitaxial semiconductor layer 120 is formed by performing a SEG method, but not limited to this. The epitaxial semiconductor layer 120 includes a thickness $T_4$, and the thickness $T_4$ can be 40 nm, but not limited to this. It is noteworthy that the epitaxial semiconductor layer 120 includes only the first semiconductor material. Therefore the epitaxial semiconductor layer 120 is a Si epitaxial layer. It is also noteworthy that the epitaxial semiconductor layer 120 is an undoped epitaxial layer. In other words, the epitaxial semiconductor layer 120 includes no conductive dopants. Therefore, the epitaxial semiconductor layer 120 is an intrinsic Si layer.

Figure 3:
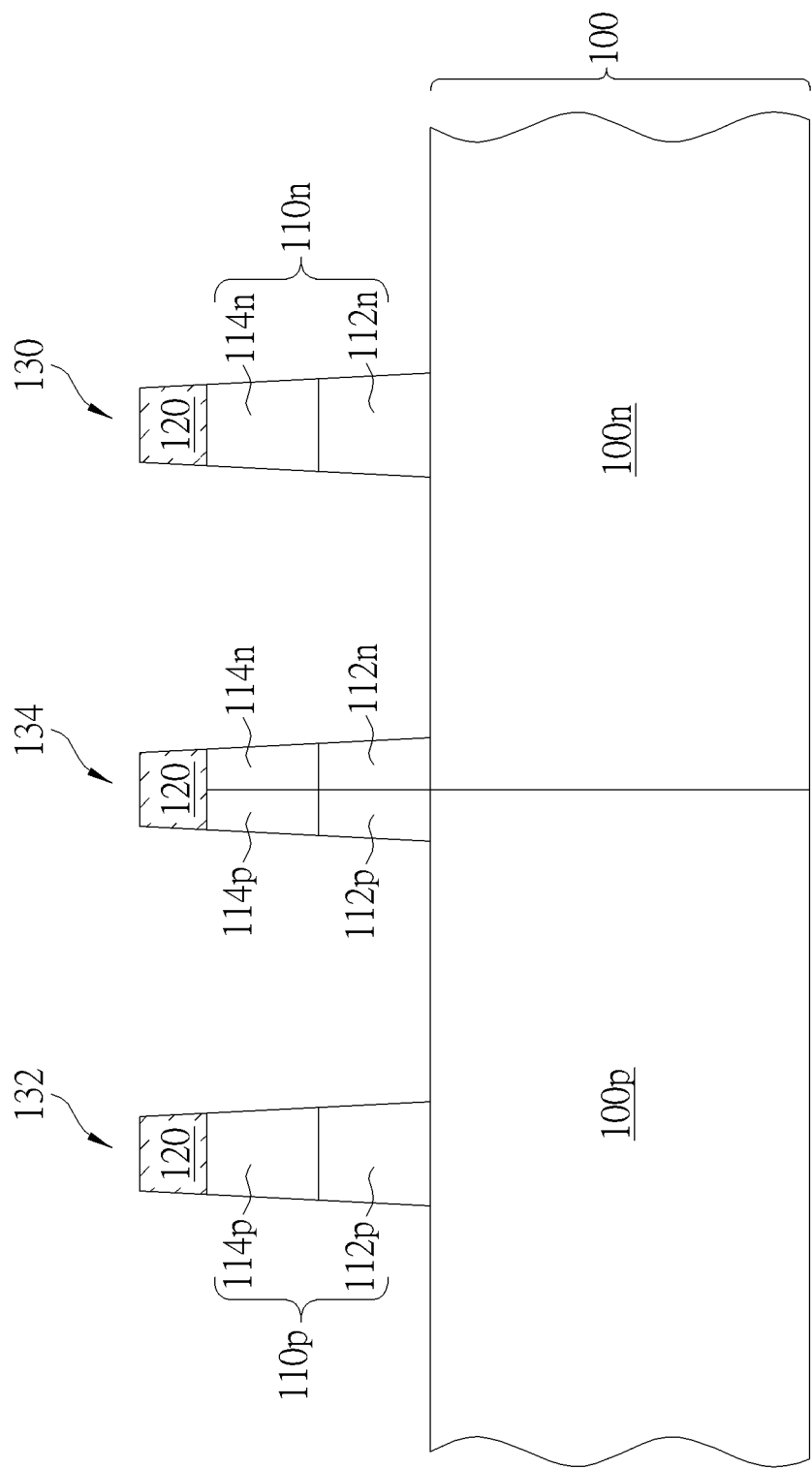

Please refer to FIG. 3. Next, the epitaxial semiconductor layer 120 and the epitaxial semiconductor layer 110 are patterned by performing, for example but not limited to, a spacer image transfer (hereinafter abbreviated as SIT) method, also known as self-aligned double patterning (SADP) method. In some embodiments of the present invention, the epitaxial semiconductor layer 120 and the epitaxial semiconductor layer 110 can be patterned by performing a double SIT method if required, but not limited to this. Consequently, a patterned epitaxial structure 130 is formed in the n-well 100n and a patterned epitaxial structure 132 is formed in the p-well 100p. Furthermore, in some embodiments of the present invention, at least an epitaxial dummy 134 is selectively formed at the boundary between the n-well 100n and the p-well 100p so that uniformity of the substrate surface is improved. In some embodiments of the present invention, a width of the patterned epitaxial structures 130/132 and the epitaxial dummy 134 obtained by patterning the epitaxial semiconductor layer 120 and the epitaxial semiconductor layer 110 with the SIT method is 48 nm, but not limited to this. In some embodiments of the present invention, the width of the patterned epitaxial structures 130/132 and the epitaxial dummy 134 obtained by patterning the epitaxial semiconductor layer 120 and the epitaxial semiconductor layer 110 with the double SIT method is 26 nm, but not limited to this. According to the preferred embodiment, the undoped Si epitaxial layer 120 of the patterned epitaxial structure 130 is taken as a first portion and the n-typed SiGe epitaxial layer 110n (that is the n-typed lower epitaxial layer 112n and the n-typed upper epitaxial layer 114n) of the patterned epitaxial structure 130 is taken as a second portion sandwiched in between the first portion and the substrate 100. In the same concept, the undoped Si epitaxial layer 120 of the patterned epitaxial structure 132 is taken as the first portion and the p-typed SiGe epitaxial layer 110p (that is the p-typed lower epitaxial layer 112p and the p-typed upper epitaxial layer 114p) is taken as a third portion sandwiched in between the first portion and the substrate 100. It is concluded that the second portion of the patterned epitaxial structure 130 and the third portion of the patterned epitaxial structure 132 include conductivity types complementary to each other.

Figure 4:
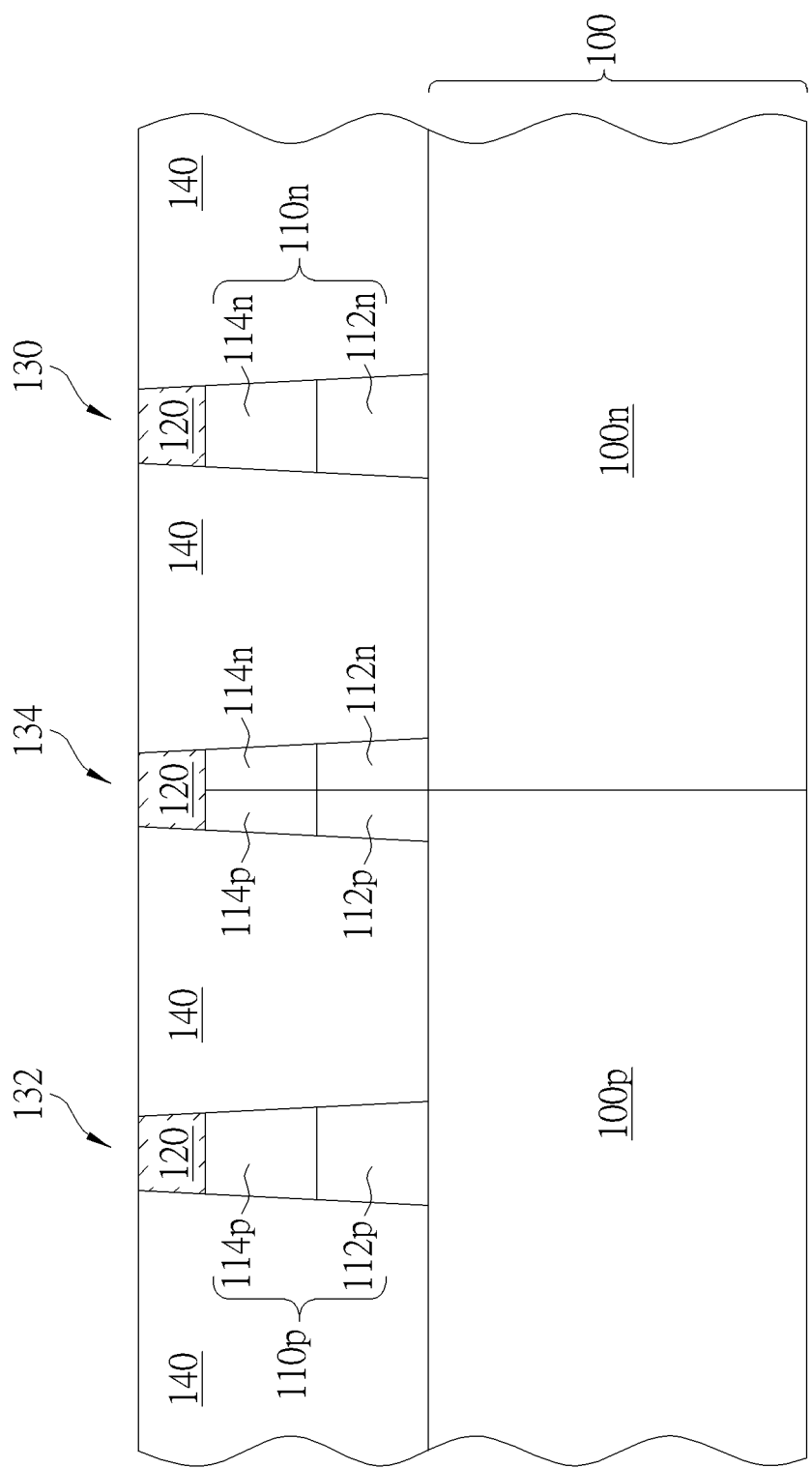

Please refer to FIG. 4. After forming the patterned epitaxial structures 130/132 and the epitaxial dummy 134, a dielectric layer 140 is formed on the substrate 100 by filling up vacancies between the patterned epitaxial structures 130/132 and the epitaxial dummy 134 with an insulating material. The insulating material may be formed by suitable oxidation and/or deposition methods. For example, this process may include a chemical vapor deposition (hereinafter abbreviated as CVD) process, and the CVD process may include a plasma-enhanced CVD (PECVD), a remote plasma-enhanced CVD (RPECVD), or an atomic-layer CVD (ALCVD). The CVD process may be either a low-pressure CVD (LPCVD) process, an ultrahigh vacuum CVD (UVCVD) process, or a low temperature chemical vapor deposition (LTCVD). In one exemplary configuration, the CVD process may include a flowable CVD (FCVD) process to deposit the oxide material using in-situ steam generated (ISSG) oxide and atomic layer deposition (ALD) oxide. Next, a planarization process is performed to remove superfluous insulating material. Thus, a surface of dielectric layer 140, top surfaces of the patterned epitaxial structures 130/132, and a top surface of the epitaxial dummy 134 are coplanar. As shown in FIG. 4, the dielectric layer 140 surrounds the patterned epitaxial structures 130/132 and the epitaxial dummy 134.

Figure 5:
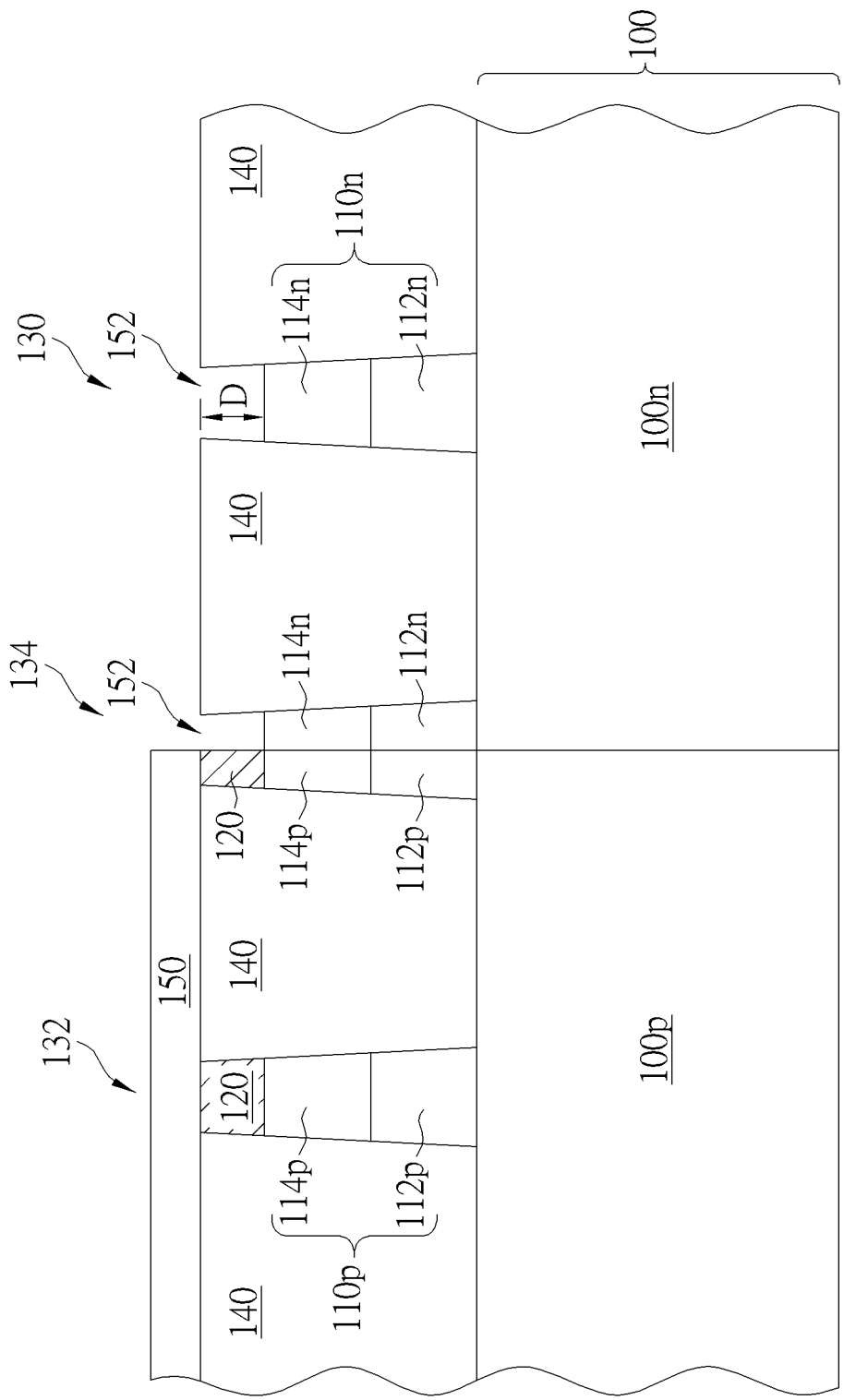

Please refer to FIG. 5. After forming the dielectric layer 140, a patterned hard mask 150 covering the dielectric layer 140 and the patterned epitaxial structure 132 in the p-well 100p is formed. In some embodiments of the present invention, the patterned hard mask 150 can even cover the epitaxial dummy 134 partially or entirely. As shown in FIG. 5, the dielectric layer 140 and the patterned epitaxial structure 130 in the n-well 100n are exposed. In some embodiments of the present invention, the epitaxial dummy 134 can be exposed partially or entirely. Next, a suitable etching process is performed to remove a portion of the patterned epitaxial structure 130. In detail, the etching process is performed to remove the first portion (that is the epitaxial semiconductor layer 120) of the patterned epitaxial structure 130 according to the preferred embodiment. Consequently, a recess 152 is formed on the n-well 100n. As shown in FIG. 5, the recess 152 includes a depth D, and the depth D of the recess 152 can be larger than or equal to the thickness $T_4$ of the first portion. Preferably, the depth D of the recess 152 is equal to the thickness $T_4$ of the first portion.

Figure 6:
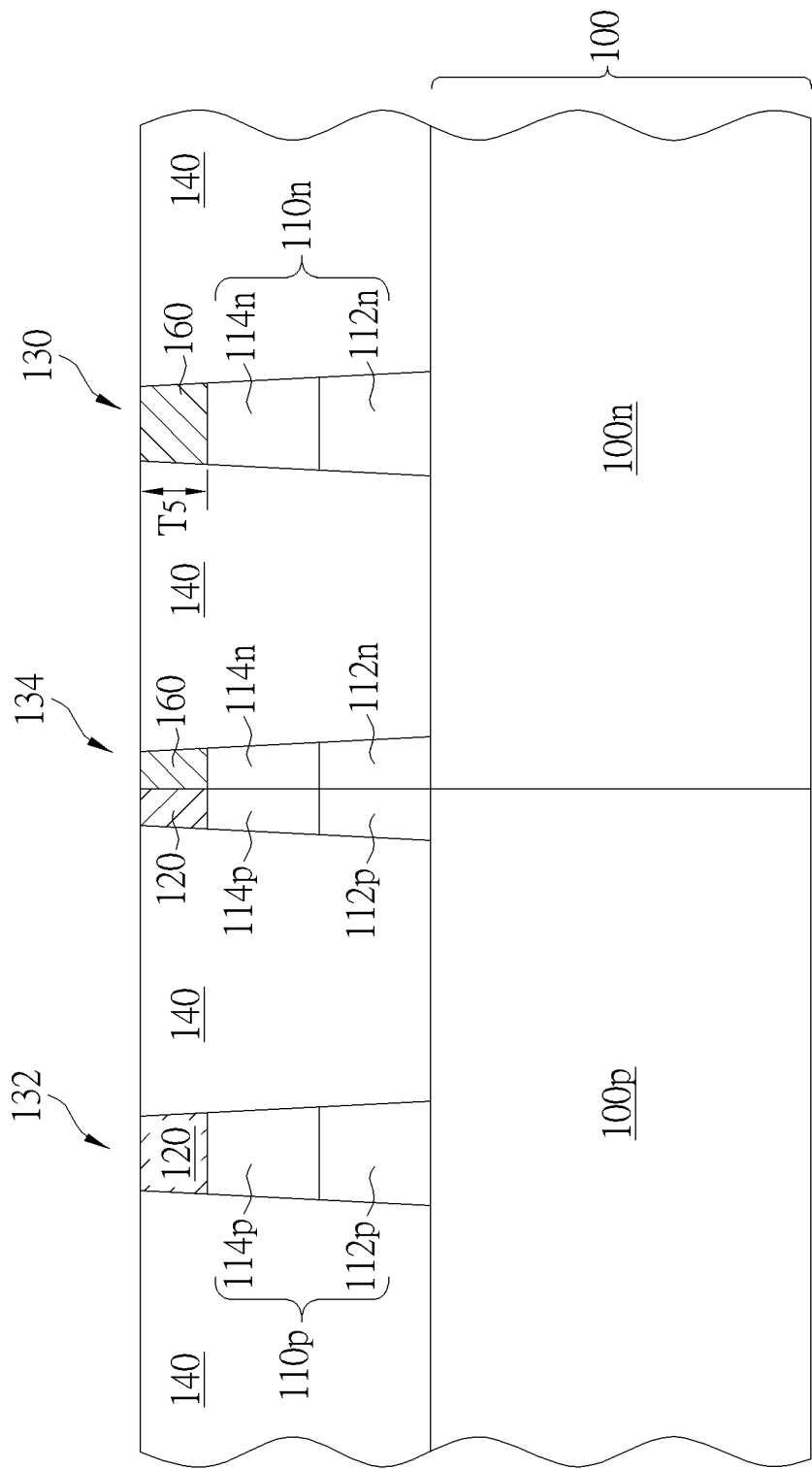

Please refer to FIG. 6. After forming the recess 152, an epitaxial semiconductor layer 160 is formed in the recess 152. The epitaxial semiconductor layer 160 can be formed by a SEG method, but not limited to this. Next, a planarization process is performed to remove superfluous epitaxial material and the patterned hard mask 150, and thus the recess 152 is filled up with the epitaxial semiconductor layer 160, and a surface of the epitaxial semiconductor layer 160, the surface of the dielectric layer 140 and the surface of the epitaxial semiconductor layer 120 are all coplanar. The epitaxial semiconductor layer 160 includes at least the second semiconductor material. As mentioned above, the second semiconductor material is Ge in the preferred embodiment. In some embodiments of the present invention, the epitaxial semiconductor layer 160 can include both of the first semiconductor material and the second semiconductor material. That is, the epitaxial semiconductor layer 160 can include SiGe. It is noteworthy that a concentration of the second semiconductor material in the epitaxial semiconductor layer 160 is larger than the concentration of the second semiconductor material in the second portion (that is the n-typed lower epitaxial layer 112n and the n-typed upper epitaxial layer 114n) of the patterned epitaxial structure 130. It is also noteworthy that the epitaxial semiconductor layer 160 is an undoped epitaxial layer. In other words, the epitaxial semiconductor layer 160 includes no conductive dopants. Therefore, the epitaxial semiconductor layer 160 is an intrinsic SiGe layer or an intrinsic Ge layer. Furthermore, the epitaxial semiconductor layer 160 includes a thickness $T_5$, and the thickness $T_5$ is equal to the depth D of the recess 152.

Figure 7:
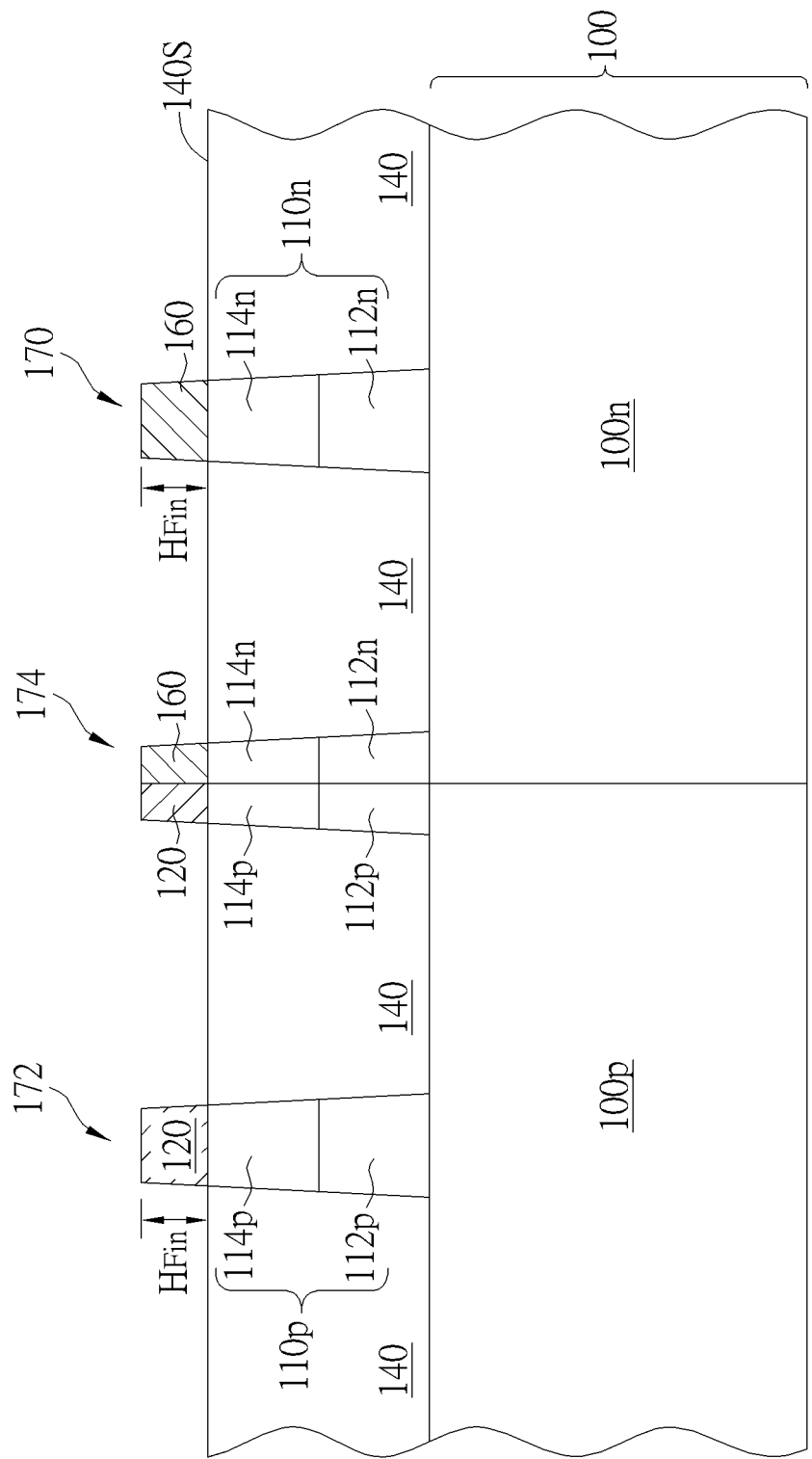

Please refer to FIG. 7. An etching back process is then performed to remove a portion of the dielectric layer 140. Consequently, a portion of or entire epitaxial semiconductor layer 160 and a portion of or entire epitaxial semiconductor layer 120 are protruded from the surface 140S of the dielectric layer 140. Thus, a fin 170 is formed on the n-well 100n, a fin 172 is formed on the p-well 100p, and a dummy fin 174 is formed on the substrate 100. As shown in FIG. 7, the fins 170/172 and the dummy fin 174 are protruded from the surface 140S of the dielectric layer 140, and thus a protruded height is defined between top surfaces of the fins 170/172 and the surface 140S of the dielectric layer 140 according to the preferred embodiment. Generally speaking, the protruded height is defined as fin height $H_{Fin}$. In the preferred embodiment, the fin height $H_{Fin}$ is smaller than or equal to the thickness $T_5$ of the epitaxial semiconductor layer 160, but not limited to this.

Figure 8:
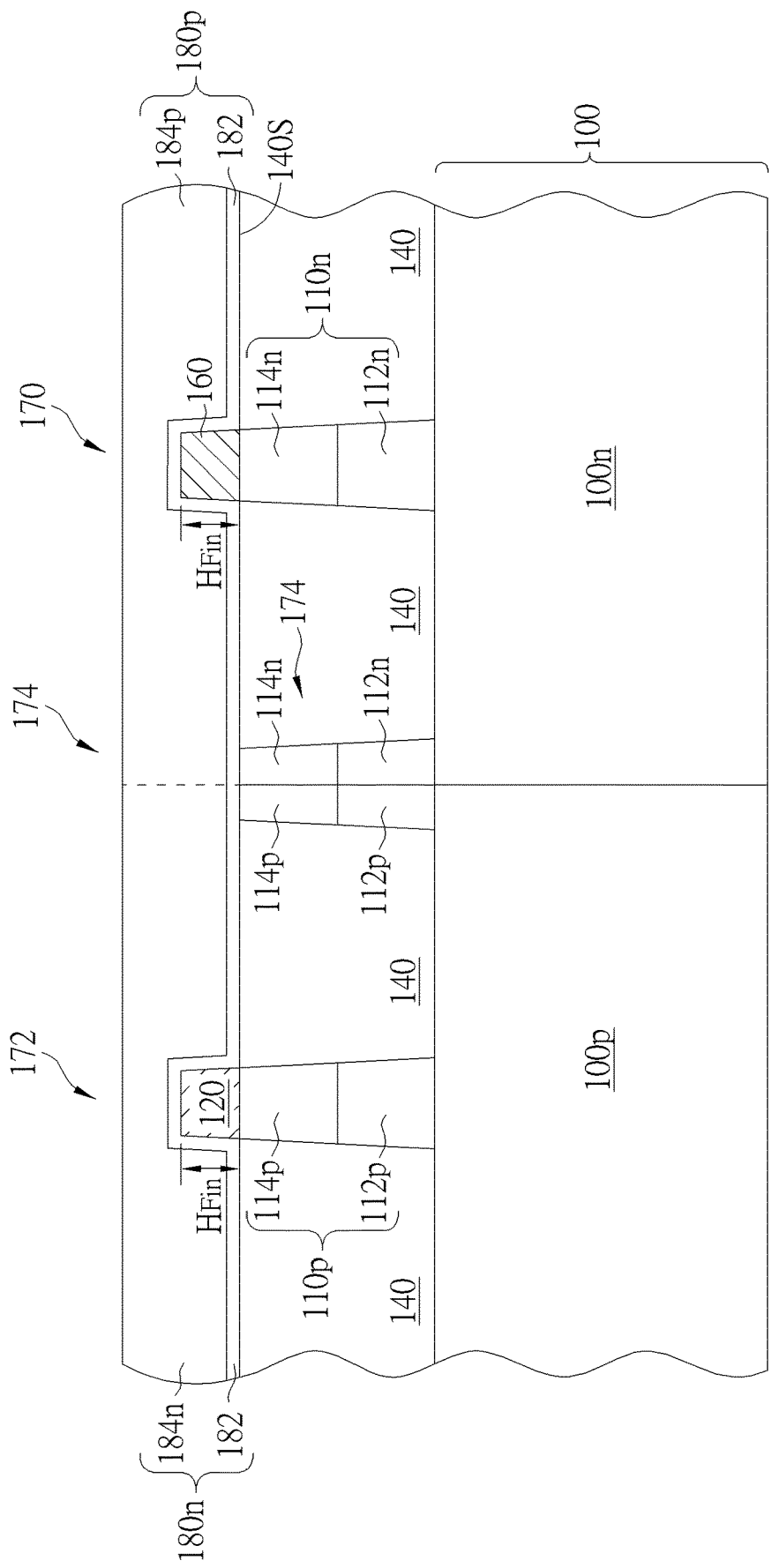

Please refer to FIG. 8. Next, the dummy fin 174 can be selectively removed if required. In some embodiments of the present invention, the dummy fin 174 remains on the substrate. Therefore removal of the dummy fin 174 is only exemplarily shown in FIG. 8, but not limited to this. Subsequently, a gate layer is formed on the substrate 100, specifically on the dielectric layer 140 and the fins 170/172. In the preferred embodiment, a p-gate layer 180p is formed on the fin 170 in the n-well 100n and an n-gate layer 180n is formed on the fin 172 in the p-well 100p. The p-gate layer 180p includes a gate dielectric layer 182 and a p-gate conductive layer 184p, and the n-gate layer 180n includes a gate dielectric layer 182 and an n-gate conductive layer 184n. It is noteworthy that the conductivity types of the gate conductive layers 184p/184n are respectively the same with the conductivity types of the to-be-formed transistors. Therefore the p-gate layer 180p on the n-well 100n is complementary to the n-typed epitaxial semiconductor layer 110n (the n-typed lower epitaxial layer 112n and the n-typed upper epitaxial layer 114n), while the n-gate layer 180n on the p-well 100p is complementary to the p-typed epitaxial semiconductor layer 110p (the p-typed lower epitaxial layer 112p and the p-typed upper epitaxial layer 114p). As shown in FIG. 7, an extending direction of the n/p-gate layers 180n/180p is perpendicular to an extending direction of the fins 170/172 and the dummy fin 174. Additionally, the n/p-gate layers 180n/180p cover a portion of tops and sidewalls of the fins 172/170, respectively.

In some embodiments of the present invention, the gate dielectric layer 182 can include the conventional dielectric material such as silicon oxide (SiO), silicon nitride (SiN), or silicon oxynitride (SiON). In some embodiments of the present invention, the gate dielectric layer 182 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 182 of the preferred embodiment adopts the high-K dielectric material, the present invention can be further integrated to the metal gate process. Therefore control gate compatible to the high-K gate dielectric layer is obtained. Accordingly, the gate conductive layers 184n/184p can include different materials according to the gate-first or gate-last process. In some embodiments of the present invention integrated to the gate-first process, the gate conductive layers 184n/184p includes metal such as tantalum (Ta), titanium (Ti), ruthenium (Ru), molybdenum (Mo), alloys of the aforementioned metals such as titanium al titanium aluminide (TiAl), metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layers 184n/184p can be a single-layered or multi-layered structure. In some embodiments of the present invention integrated to the gate-last process, the gate conductive layers 184n/184p serve as a dummy gate and includes semiconductor material such as polysilicon. Thereafter, steps for forming fin field effect transistor (hereinafter abbreviated as FinFET) are performed. Consequently, a p-FinFET (not shown) is formed on the n-well 100n and an n-FinFET (not shown) is formed on the p-well 100p.

Please still refer to FIG. 8. According to the preferred embodiment, the fin 170 formed on the n-well 100n includes the undoped epitaxial semiconductor layer 160 and the n-typed epitaxial semiconductor layer 110n while the fin 172 formed on the p-well 100p includes the undoped epitaxial semiconductor layer 120 and p-typed epitaxial semiconductor layer 110p. It is noteworthy that though the conductivity types of the n-typed epitaxial semiconductor layer 110n and the p-typed epitaxial semiconductor layer 110p are complementary to each other, Si/Ge ratio (that is the ratio of the first semiconductor material and the second semiconductor material) in the epitaxial semiconductor layers 110n and 110p are identical. In the fin 170, the Si concentration of the epitaxial semiconductor layer 160 is smaller than the Si concentration of the n-typed the epitaxial semiconductor layer 110n. In other words, the Ge concentration of the epitaxial semiconductor layer 160 is larger than the Ge concentration of the n-typed epitaxial semiconductor layer 110n. Consequently, a compressive stress is generated from the epitaxial semiconductor layer 160 to the n-typed epitaxial semiconductor layer 110n, and thus carrier mobility in the channel region of the p-FinFET is improved. Furthermore, since the Ge concentration of the n-typed epitaxial semiconductor layer 110n is between that of the epitaxial semiconductor layer 160 and the substrate 100, the n-typed epitaxial semiconductor layer 110n serves as a strain relaxed buffer (hereinafter abbreviated as SRB) layer. Consequently, the growth of dislocation defects due to lattice mismatch is confined in this SRB layer. In the fin 172, the Si concentration of the epitaxial semiconductor layer 120 is larger than the Si concentration of the p-typed epitaxial semiconductor layer 110p. Therefore a tensile stress is generated from the epitaxial semiconductor layer 120 to the p-typed epitaxial semiconductor layer 110p, and thus carrier mobility in the channel region of the n-FinFET is improved. In addition, the Si concentration of the epitaxial semiconductor layer 120 in the fin 172 is larger than the Si concentration of the epitaxial semiconductor layer 160 in the fin 170. It is also noteworthy that since the n-typed epitaxial semiconductor layer 110n is complementary to the p-FinFET and the p-typed epitaxial semiconductor layer 110p is complementary to the n-FinFET, the n/p-epitaxial semiconductor layers 110n/110p formed under the epitaxial semiconductor layers 160/120 (where the channels are to be formed) respectively serve as an anti-punch through (hereinafter abbreviated as APT) layer, and thus punch through effect is avoided.

Figure 9:
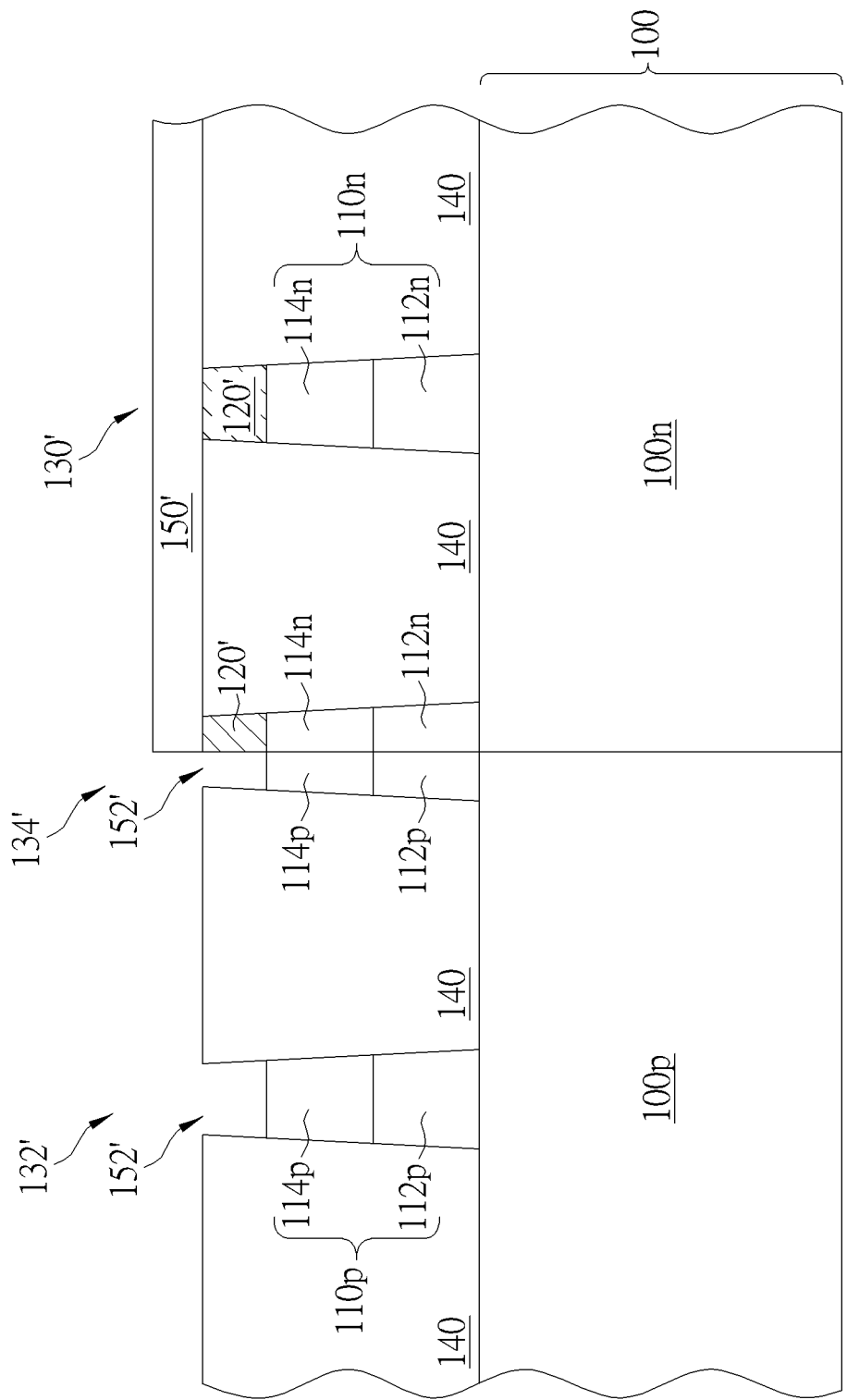
Figure 10:
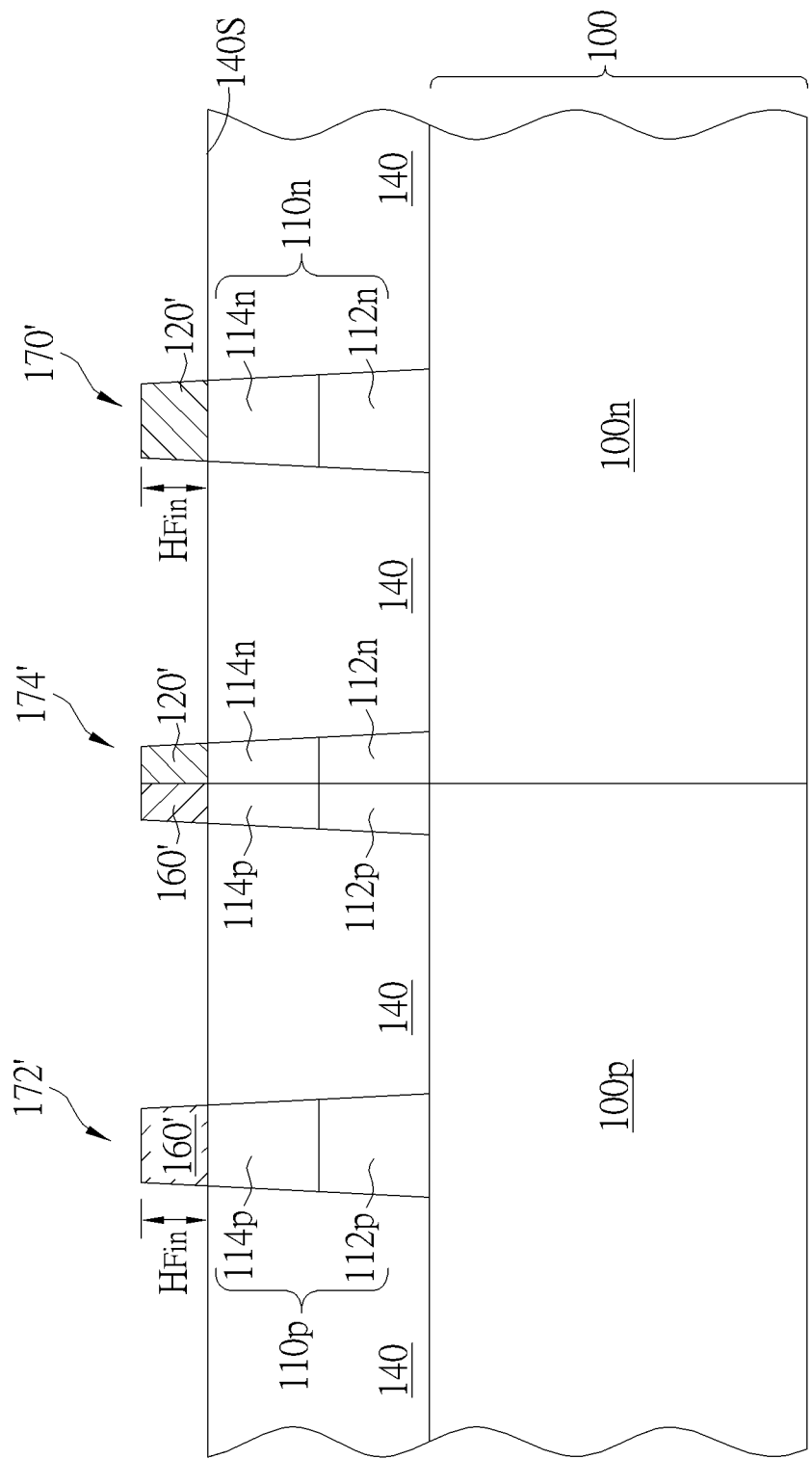

Please refer to FIGS. 9-10, which are schematic drawings illustrating a method for manufacturing fins provided by a second preferred embodiment of the present invention. It is noteworthy that elements the same in the first and second preferred embodiments can include the same materials and formed by the same processes, and thus those details are omitted in the interest of brevity. It should be understood that elements the same in the first and second preferred embodiments are designated by the same numerals. As shown in FIG. 9, a substrate 100 is provided according to the preferred embodiment. The substrate 100 includes a first semiconductor material such as Si. And an n-well 100n and a p-well 100p are formed in the substrate 100. Subsequently, SEG methods, ion implantations, and thermal treatment as mentioned above are performed, and thus an n-typed lower epitaxial layer 112n is formed on the n-well 100n and a p-typed lower epitaxial layer 112p is formed on the p-well 100p. As mentioned above, the n/p-typed lower epitaxial layers 112n/112p include the first semiconductor material and a second semiconductor material, and a lattice constant of the second semiconductor material is different from a lattice constant of the first semiconductor material. In the preferred embodiment, the lattice constant of the second semiconductor material is larger than the lattice constant of the first semiconductor material. For example, the second semiconductor material provided by the preferred embodiment is Ge, but not limited to this.

Please refer to FIG. 9 again. After forming the n-typed lower epitaxial layer 112n and the p-typed lower epitaxial layer 112p, the SEG methods, the ion implantations, and the thermal treatment as mentioned above are performed, and thus an n-typed upper epitaxial layer 114n is formed on the n-typed lower epitaxial layer 112n and a p-typed upper epitaxial layer 114p is formed on the p-typed lower epitaxial layer 112p. As mentioned above, the n/p-typed upper epitaxial layers 114n/114p also include the first semiconductor material and the second semiconductor material. Thus, the n/p-typed upper epitaxial layers 114n/114p are SiGe epitaxial layers. It is noteworthy that a concentration of the second semiconductor material in the n/p-typed upper epitaxial layers 114n/114p is larger than a concentration of the second semiconductor material in the n/p-typed lower epitaxial layers 112n/112p. As shown in FIG. 9, the n-typed upper and lower epitaxial layers 114n/112n construct an n-typed epitaxial semiconductor layer 110n while the p-typed upper and lower epitaxial layers 114p/112p construct a p-typed epitaxial semiconductor layer 110p.

Please still refer to FIG. 9. After forming the n/p-typed epitaxial semiconductor layers 110n/110p, which include both of the first semiconductor material and the second semiconductor material, another epitaxial semiconductor layer 120' is formed on the n/p-typed epitaxial semiconductor layers 110n/110p. The epitaxial semiconductor layer 120' includes a thickness, and the thickness can be 40 nm, but not limited to this. It is noteworthy that the epitaxial semiconductor layer 120' includes only the second semiconductor material in accordance with the preferred embodiment, therefore the epitaxial semiconductor layer 120' is a Ge epitaxial layer. However, in some embodiments of the present invention, the epitaxial semiconductor layer 120' can include both the first semiconductor material and the second semiconductor material, such as SiGe. It is noteworthy that in those embodiments, a concentration of the second semiconductor material in the epitaxial semiconductor layer 120' is always larger than the concentration of the second semiconductor material in the underneath n/p-typed the upper epitaxial layers 114n/114p. Furthermore, the epitaxial semiconductor layer 120' is an undoped epitaxial layer. In other words, the epitaxial semiconductor layer 120' includes no conductive dopants. Therefore, the epitaxial semiconductor layer 120' is an intrinsic Ge layer or an intrinsic SiGe layer.

Please still refer to FIG. 9. Next, the epitaxial semiconductor layer 120' and the n/p-typed epitaxial semiconductor layers 110n/110p are patterned to form a patterned epitaxial structure 130' on the n-well 100n and a patterned epitaxial structure 132' on the p-well 100p. Furthermore, in some embodiments of the present invention, at least an epitaxial dummy 134' is selectively formed at the boundary between the n-well 100n and the p-well 100p so that uniformity of the substrate surface is improved. According to the preferred embodiment, the undoped Ge epitaxial layer 120' of the patterned epitaxial structure 130' is taken as a first portion and the n-typed SiGe epitaxial layer 110n (that is the n-typed lower epitaxial layer 112n and the n-typed upper epitaxial layer 114n) of the patterned epitaxial structure 130' is taken as a second portion sandwiched in between the first portion and the substrate 100. In the same concept, the undoped Ge epitaxial layer 120' of the patterned epitaxial structure 132' is taken as the first portion and the p-typed SiGe epitaxial layer 110p (that is the p-typed lower epitaxial layer 112p and the p-typed upper epitaxial layer 114p) is taken as a third portion sandwiched in between the first portion and the substrate 100. It is concluded that the second portion of the patterned epitaxial structure 130' and the third portion of the patterned epitaxial structure 132' include conductivity types complementary to each other.

Please still refer to FIG. 9. After forming the patterned epitaxial structures 130'/132' and the epitaxial dummy 134', a dielectric layer 140 is formed on the substrate 100 to fill up vacancies between the patterned epitaxial structures 130'/132' and the epitaxial dummy 134', and followed by forming a patterned hard mask 150'. The patterned hard mask 150' covers the dielectric layer 140 and the patterned epitaxial structure 130' in the n-well 100n. Next, a suitable etching process is performed to remove exposed portion of the patterned epitaxial structure 132'. In detail, the etching process is performed to remove the first portion (that is the epitaxial semiconductor layer 120') of the patterned epitaxial structure 132'. Consequently, a recess 152' is formed on the p-well 100p, as shown in FIG. 9.

Please refer to FIG. 10. After forming the recess 152', an epitaxial semiconductor layer 160' is formed in the recess 152'. The epitaxial semiconductor layer 160' can be formed by a SEG method, but not limited to this. Next, a planarization process is performed to remove superfluous epitaxial material and the patterned hard mask 150', and thus the recess 152' is filled up with the epitaxial semiconductor layer 160'. A surface of the epitaxial semiconductor layer 160', a surface of the dielectric layer 140 and a surface of the epitaxial semiconductor layer 120' are all coplanar. It is noteworthy that in the preferred embodiment, the epitaxial semiconductor layer 160' includes only the first semiconductor material. Therefore the epitaxial semiconductor layer 160' is a Si epitaxial layer. It is also noteworthy that the epitaxial semiconductor layer 160' is an undoped epitaxial layer. In other words, the epitaxial semiconductor layer 160' includes no conductive dopants. Therefore, the epitaxial semiconductor layer 160' is an intrinsic Si layer. Furthermore, the epitaxial semiconductor layer 160' includes a thickness (not shown), and the thickness of the epitaxial semiconductor layer 160' is equal to the depth of the recess 152'.

Please refer to FIG. 10 again. An etching back process is then performed to remove a portion of the dielectric layer 140. Consequently, a portion of or entire epitaxial semiconductor layer 160' and a portion of or entire epitaxial semiconductor layer 120' are protruded from the surface 140S of the dielectric layer 140. Thus, a fin 170' is formed on the n-well 100n, a fin 172' is formed on the p-well 100p, and a dummy fin 174' is formed on the substrate 100. As shown in FIG. 10, the fins 170'/172' and the dummy fin 174' are protruded from the surface 140S of the dielectric layer 140, and thus a protruded height is defined between top surfaces of the fins 170'/172' and the surface 140S of the dielectric layer 140 according to the preferred embodiment. As mentioned above, the protruded height is defined as fin height $H_{Fin}$. In the preferred embodiment, the fin height $H_{Fin}$ is smaller than or equal to the thickness of the epitaxial semiconductor layer 160', but not limited to this.

Next, the dummy fin 174' can be selectively removed if required. Subsequently, a gate layer is formed on the substrate 100, specifically on the dielectric layer 140 and the fins 170'/172'. As mentioned above, a p-gate layer (not show) is formed on the fin 170' in the n-well 100n, and an n-gate layer (not shown) is formed on the fin 172' in the p-well 100p. Thereafter, steps for forming FinFET are performed. Consequently, a p-FinFET (not shown) is formed on the n-well 100n and an n-FinFET (not shown) is formed on the p-well 100p. Since those steps are the same with the first preferred embodiment, those details are omitted in the interest of brevity.

Please still refer to FIG. 10. According to the preferred embodiment, the fin 170' formed on the n-well 100n includes the undoped epitaxial semiconductor layer 120' and the n-typed epitaxial semiconductor layer 110n while the fin 172' formed on the p-well 100p includes the undoped epitaxial semiconductor layer 160' and p-typed epitaxial semiconductor layer 110p. As mentioned above, though the conductivity types of the n-typed epitaxial semiconductor layer 110n and the p-typed epitaxial semiconductor layer 110p are complementary to each other, Si/Ge ratio (that is the ratio of the first semiconductor material and the second semiconductor material) in the n-typed epitaxial semiconductor layer 110n and the p-typed epitaxial semiconductor layer 110p are identical. In the fin 170', the Si concentration in the epitaxial semiconductor layer 120' is smaller than the Si concentration of the n-typed the epitaxial semiconductor layer 110n. In other words, the Ge concentration in the epitaxial semiconductor layer 120' is larger than the Ge concentration of the n-typed epitaxial semiconductor layer 110n. Consequently, a compressive stress is generated from the epitaxial semiconductor layer 120' to the n-typed epitaxial semiconductor layer 110n, and thus carrier mobility in the channel region of the p-FinFET is improved. Furthermore, since the Ge concentration of the n-typed epitaxial semiconductor layer 110n is between that of the epitaxial semiconductor layer 120' and the substrate 100, the n-typed epitaxial semiconductor layer 110n serves as a SRB layer. In the fin 172', the Si concentration of the epitaxial semiconductor layer 160' is larger than the Si concentration of the p-typed epitaxial semiconductor layer 110p. Therefore a tensile stress is generated from the epitaxial semiconductor layer 160' to the p-typed epitaxial semiconductor layer 110p, and thus carrier mobility in the channel region of the n-FinFET is improved. It is also noteworthy that since the n-typed epitaxial semiconductor layer 110n is complementary to the p-FinFET and the p-typed epitaxial semiconductor layer 110p is complementary to the n-FinFET, the n-typed epitaxial semiconductor layers 110n formed under the epitaxial semiconductor layer 120' (where the channel is formed) and the p-typed epitaxial semiconductor layer 110p formed under the epitaxial semiconductor layer 160' (where the channel is formed) respectively serve as an APT layer, and thus punch through effect is avoided.

According to the first and second preferred embodiments mentioned above, it is concluded that the present invention provides a replacement fin process integrated with STI-last approach: a portion of the patterned epitaxial structure is removed and replaced with another epitaxial layer. Thus the resulted fins are able to render the tensile or the compressive stresses due to the different materials/concentrations. In other words, different stressors and different channels required by transistors including complementary conductivity types are formed by the manufacturing method provided by the present invention.

Please refer to FIGS. 11-16, which are schematic drawings illustrating a method for manufacturing fins provided by a third preferred embodiment of the present invention. It is noteworthy that elements the same in the first and third preferred embodiments can include the same materials and formed by the same processes, and thus those details are omitted in the interest of brevity.

Figure 11:
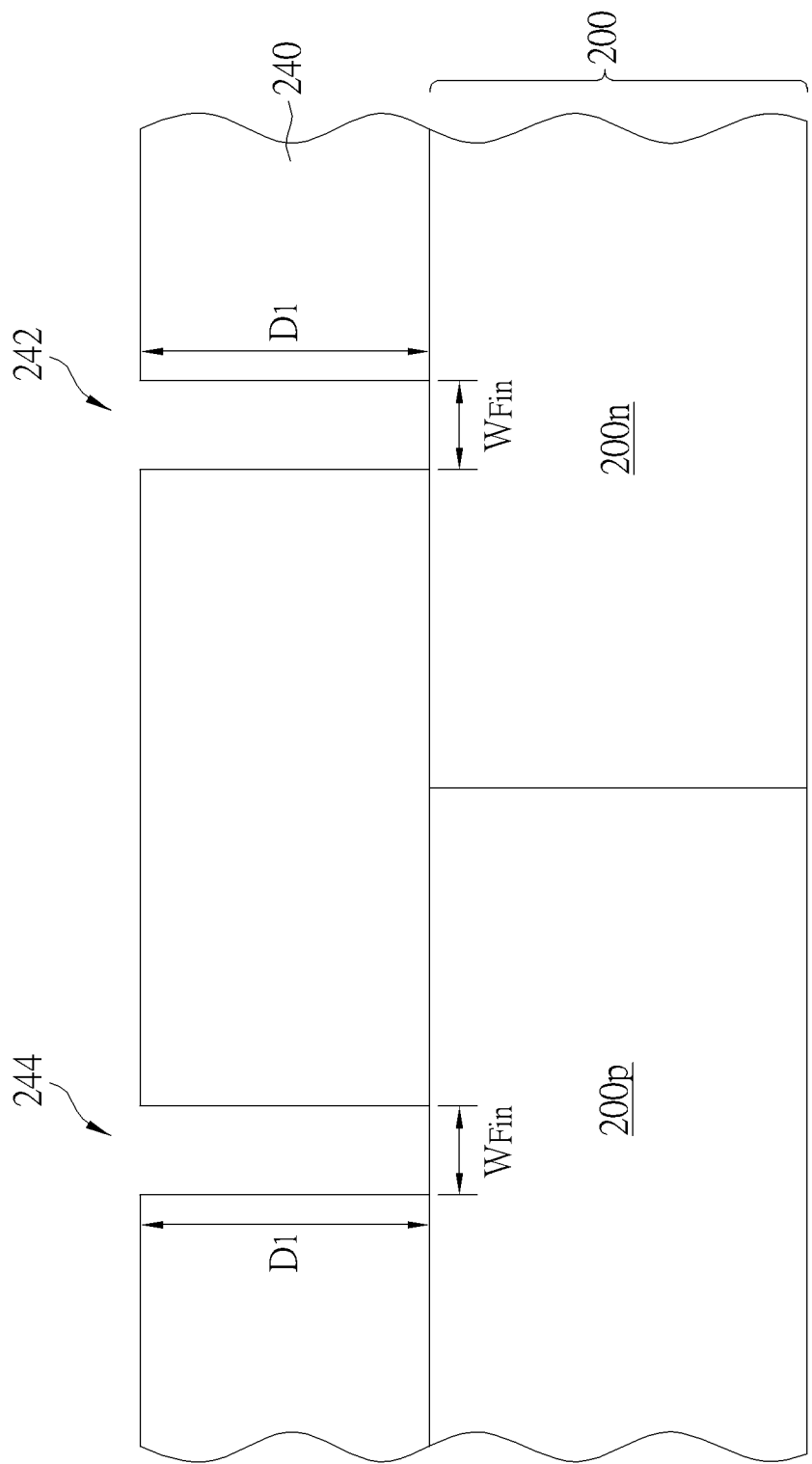

As shown in FIG. 11, a substrate 200 is provided according to the preferred embodiment. The substrate 200 includes a first semiconductor material such as Si. As shown in FIG. 11, an n-well 200n and a p-well 200p is formed in the substrate 200. Then, a dielectric layer 240 is formed on the substrate 200. The dielectric structure 240 can be formed by any suitable process such as shallow trench isolation (hereinafter abbreviated as STI) fabricating process. Generally speaking, a pad layer (not shown) and a hard mask layer (not shown) are formed on the substrate 200 and followed by patterning. The patterned hard mask layer and pad layer are used to define place and width of fin(s) to be formed, but not limited to this. Next, the substrate 200 is etched with the patterned hard mask layer and pad layer serving as etching mask, and thus a plurality of trenches (not shown) are formed in the substrate 200. Subsequently, an insulating material is formed to fill up the trenches.

Next, a planarization process is performed to remove superfluous insulating material and the patterned hard mask layer/pad layer. Consequently, a plurality of STIs are formed on the substrate 200, and those STIs are taken as the dielectric layer 240 in the preferred embodiment. A dry etching process is then performed to remove the substrate 200 formed in between the STIs 240, and thus a plurality of trenches 242/244 are formed in the dielectric layer 240. It is noteworthy that at least a trench 242 is formed in the dielectric layer 240 on the n-well 200n, and at least a trench 244 is formed in the dielectric layer 240 on the p-well 200p. According to the preferred embodiment, bottoms of the trenches 242/244 are coplanar with a bottom of the dielectric layer 240 as shown in FIG. 11. Furthermore, the trenches 242/244 include a width $W_{Fin}$ and a depth $D_1$. According to the preferred embodiment, the width $W_{Fin}$ of the recess 204 is equal to a width of fins to be formed. In some embodiments of the present invention, the depth $D_1$ of the trenches 242/244 can be between 100 nm and 300 nm, but not limited to this.

Furthermore, in a modification to the preferred embodiment, the dry etching process used to form the trenches 242/244 can be performed to over-etch the substrate 200. Therefore, the bottoms of the resulted trenches 242/244 are lower than the bottom of the dielectric layer 240. Additionally, in another modification to the preferred embodiment, other trenches can be formed in the dielectric layer 240 at anywhere required. And those trenches are used to accommodate epitaxial dummy (s) or dummy fin (s) in the following steps.

Figure 12:
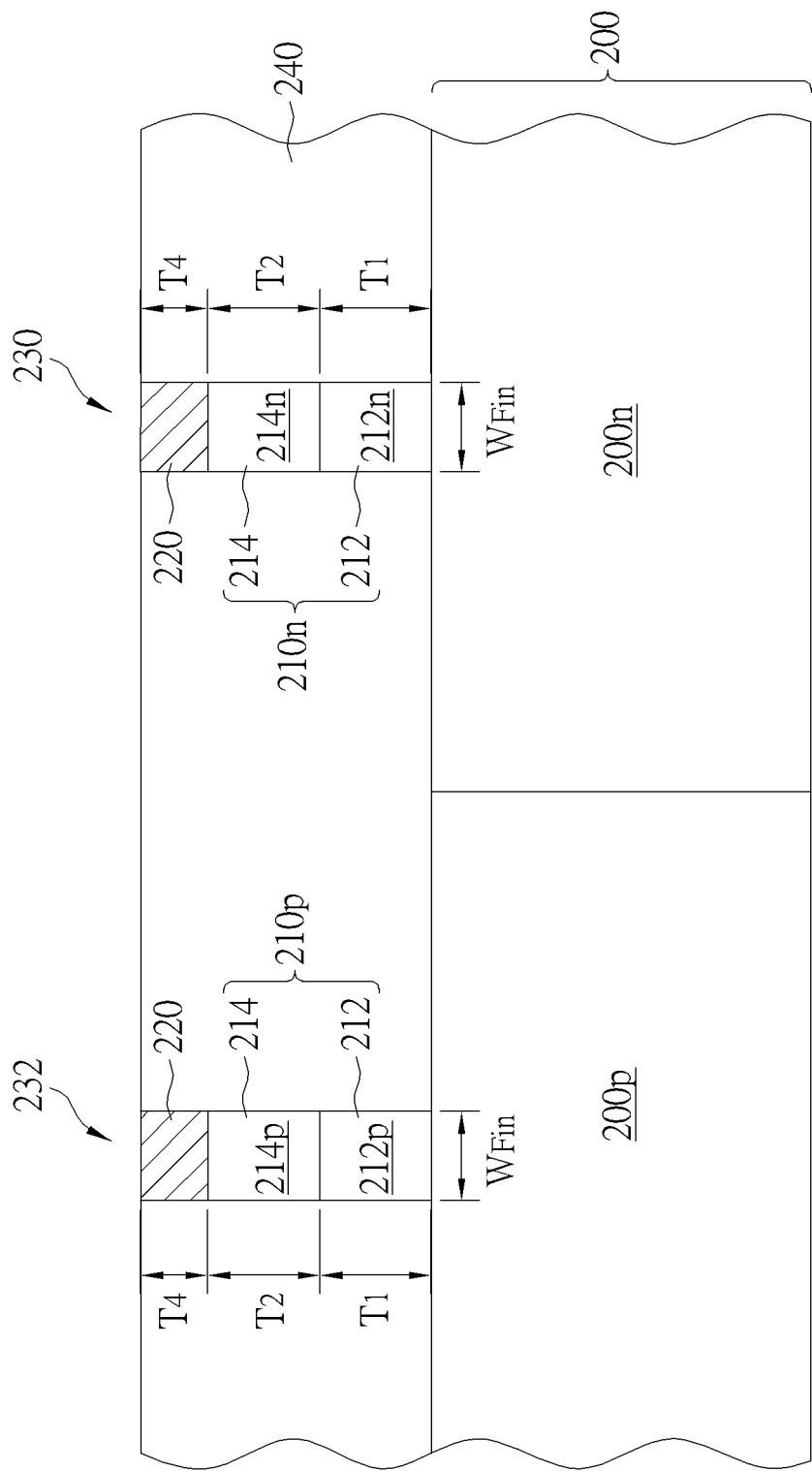

Please refer to FIG. 12. Next, a lower epitaxial layer 212 is formed on the substrate 200 by performing a SEG method. The lower epitaxial layer 212 includes a thickness $T_1$ and the thickness $T_1$ can be 100 nm, but not limited to this. The lower epitaxial layer 212 includes the first semiconductor material and a second semiconductor material, and a lattice constant of the second semiconductor material is different from a lattice constant of the first semiconductor material. In the preferred embodiment, the lattice constant of the second semiconductor material is larger than the lattice constant of the first semiconductor material. For example, the second semiconductor material provided by the preferred embodiment is Ge, but not limited to this. Accordingly, the lower epitaxial layer 212 is a SiGe epitaxial layer. A concentration of the second semiconductor material in the lower epitaxial layer 212 can be approximately 20%, but not limited to this. More important, an n-typed ion implantation and a p-typed ion implantation are performed after forming the lower epitaxial layer 212. Accordingly, n-typed dopants such as P are implanted into the lower epitaxial layer 212 on the n-well 200n, and p-typed dopants such as B are implanted into the lower epitaxial layer 212 on the p-well 200p. And a suitable thermal treatment known in the art is subsequently performed. Consequently, an n-typed lower epitaxial layer 212n is formed on the n-well 200n and a p-typed lower epitaxial layer 212p is formed on the p-well 200n as shown in FIG. 12.

Please still refer to FIG. 12. After forming the n-typed lower epitaxial layer 212n and the p-typed lower epitaxial layer 212p, another SEG method is performed and thus an upper epitaxial layer 214 is formed on both of the n-typed lower epitaxial layer 212n and the p-typed lower epitaxial layer 212p. The upper epitaxial layer 214 includes a thickness $T_2$, and the thickness $T_2$ can be approximately 100 nm, but not limited to this. The upper epitaxial layer 214 includes the first semiconductor material and the second semiconductor material, thus the upper epitaxial layer 214 also is a SiGe epitaxial layer. It is noteworthy that a concentration of the second semiconductor material in the upper epitaxial layer 214 is larger than the concentration of the second semiconductor material in the lower epitaxial layer 212. For example but not limited to, the concentration of the second semiconductor material in the upper epitaxial layer 214 can be approximately 40%. After forming the upper epitaxial layer 214, an n-typed ion implantation and a p-typed ion implantation are performed. Accordingly, n-typed dopants such as P are implanted into the upper epitaxial layer 214 on the n-typed lower epitaxial layer 212n, and p-typed dopants such as B are implanted into the upper epitaxial layer 214 on the p-typed lower epitaxial layer 212p. And a suitable thermal treatment known in the art is performed thereafter. Consequently, an n-typed upper epitaxial layer 214n is formed on the n-typed lower epitaxial layer 212n, and a p-typed upper epitaxial layer 214p is formed on the p-typed lower epitaxial layer 212p.

In the preferred embodiment, the n-typed lower epitaxial layer 212n and the n-typed upper epitaxial layer 214n construct an n-typed epitaxial semiconductor layer 210n. And thus a thickness of the n-typed epitaxial semiconductor layer 210n is a sum of the thickness $T_2$ of the n-typed upper epitaxial layer 214n and the thickness $T_1$ of the n-typed lower epitaxial layer 212n. In the same concept, the p-typed lower epitaxial layer 212p and the p-typed upper epitaxial layer 214p construct a p-typed epitaxial semiconductor layer 210p. And a thickness of the p-typed epitaxial semiconductor layer 210p is a sum of the thickness $T_2$ of the p-typed upper epitaxial layer 214p and the thickness $T_1$ of the p-typed lower epitaxial layer 212p. As shown in FIG. 12, the n/p-typed epitaxial semiconductor layers 210n/210p are multiple layers with upwardly increased Ge concentration and upwardly increased n/p-typed dopant concentrations. However it should be easily realized by those skilled in the art that the concentrations of the second semiconductor material in the lower epitaxial layer 212 and the upper epitaxial layer 214 are not limited to this. Those concentrations can be adjusted depending on different process and/or product requirements as long as the concentration of the second semiconductor material in the lower epitaxial layer 212 is smaller than the concentration of the second semiconductor material in the upper epitaxial layer 214. Furthermore, in some embodiments of the present invention, at least a middle epitaxial layer (not shown) can be formed in between the upper epitaxial layer 214 and the lower epitaxial layer 212. The middle epitaxial layer(s) also includes the first semiconductor material and the second semiconductor material, and a concentration of the second semiconductor material in the middle epitaxial layer(s) is between the concentrations of the second semiconductor material in the upper and lower epitaxial layers 214/212. In other words, in the embodiments of the present invention, the epitaxial semiconductor layer 210 includes a multiple layer with Ge concentration upwardly increased. For example but not limited to, the Ge concentration in the epitaxial semiconductor layer 210 is upwardly increased or graded from 0% to 50% while concentrations of the n/p-typed dopants are also upwardly increased or graded.

However, according to a modification to the present invention, the n/p-typed epitaxial semiconductor layers 210n/210p can be a single layer. A Ge concentration in the single-layered epitaxial semiconductor layer can be fixed to 30%. However, it should be easily realized that the Ge concentration can be modified according to different product requirements. The single-layered epitaxial semiconductor layer includes a thickness, and the thickness can be 200 nm, but not limited to this. As mentioned above, an n-typed ion implantation and a p-typed ion implantation are performed after forming the single-layered epitaxial semiconductor layer. Thus, n-typed dopants such as P are implanted into the single-layered epitaxial semiconductor layer on the n-well 100n and p-typed dopants such as B are implanted into the single-layered epitaxial semiconductor layer on the p-well 100p. Then, a suitable thermal treatment known in the art is performed. Consequently, a single-layered n-typed epitaxial semiconductor layer is formed on the n-well 200n and a single-layered p-typed epitaxial semiconductor layer is formed on the p-well 200n.

Please refer to FIG. 12. After forming the n/p-typed epitaxial semiconductor layers 210n/210p including the first semiconductor material and the second semiconductor material, another epitaxial semiconductor layer 220 is formed. The epitaxial semiconductor layer 220 is formed by performing a SEG method, but not limited to this. The trenches 242/244 are filled up with the epitaxial semiconductor layer 220. The epitaxial semiconductor layer 220 includes a thickness $T_4$, and the thickness $T_4$ can be 40 nm, but not limited to this. It is noteworthy that the epitaxial semiconductor layer 220 includes only the first semiconductor material. Therefore the epitaxial semiconductor layer 220 is a Si epitaxial layer. It is also noteworthy that the epitaxial semiconductor layer 220 is an undoped epitaxial layer. In other words, the epitaxial semiconductor layer 220 includes no conductive dopants. Therefore, the epitaxial semiconductor layer 220 is an intrinsic Si layer. Accordingly, an epitaxial structure 230 is formed in the dielectric layer 240 on the n-well 200n, and an epitaxial structure 232 is formed in the dielectric layer 240 on the p-well 200p. According to the preferred embodiment, the undoped Si epitaxial layer 220 of the epitaxial structure 230 is taken as a first portion and the n-typed SiGe epitaxial layer 210n (that is the n-typed lower epitaxial layer 212n and the n-typed upper epitaxial layer 214n) is taken as a second portion sandwiched in between the first portion and the substrate 200. In the same concept, the undoped Si epitaxial layer 220 of the epitaxial structure 232 is taken as the first portion and the p-typed SiGe epitaxial layer 210p (that is the p-typed lower epitaxial layer 212p and the p-typed upper epitaxial layer 214p) is taken as a third portion sandwiched in between the first portion and the substrate 200. It is concluded that the second portion of the epitaxial structure 230 and the third portion of the epitaxial structure 232 include conductivity types complementary to each other.

Figure 13:
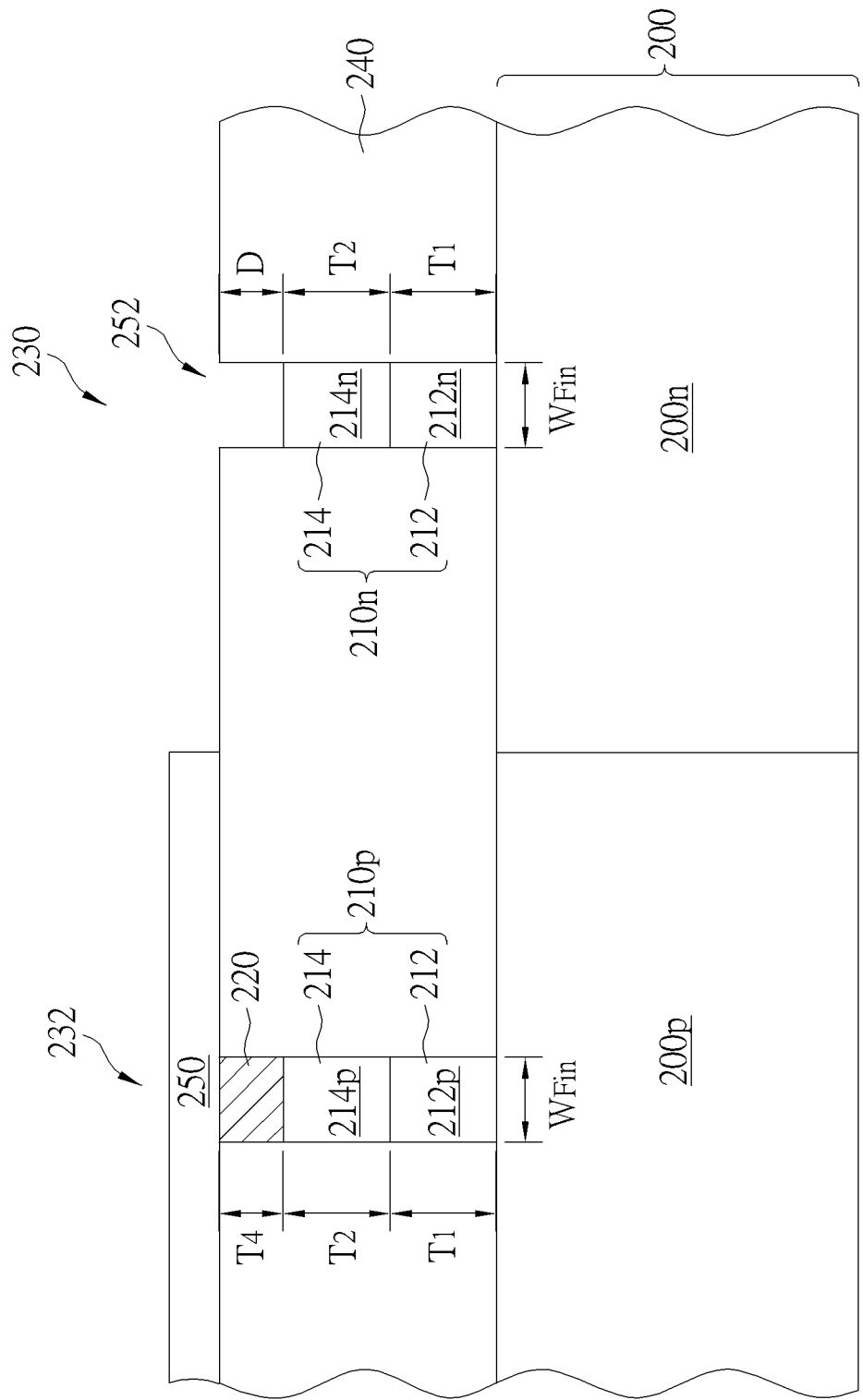

Please refer to FIG. 13. After forming the epitaxial structures 230/232 in the dielectric layer 240, a patterned hard mask 250 covering the dielectric layer 240 and the epitaxial structure 232 in the p-well 200p is formed. In other words, the dielectric layer 240 and the epitaxial structure 230 on the n-well 200n are exposed. Next, a suitable etching process is performed to remove a portion of the epitaxial structure 230. In detail, the etching process is performed to remove the first portion (that is the epitaxial semiconductor layer 220) of the epitaxial structure 230 in the preferred embodiment. Consequently, a recess 252 is formed on the n-well 200n. As shown in FIG. 13, the recess 252 includes a depth D, and the depth D of the recess 252 can be larger than or equal to the thickness $T_4$ of the first portion. Preferably, the depth D of the recess 252 is equal to the thickness $T_4$ of the first portion.

Figure 14:
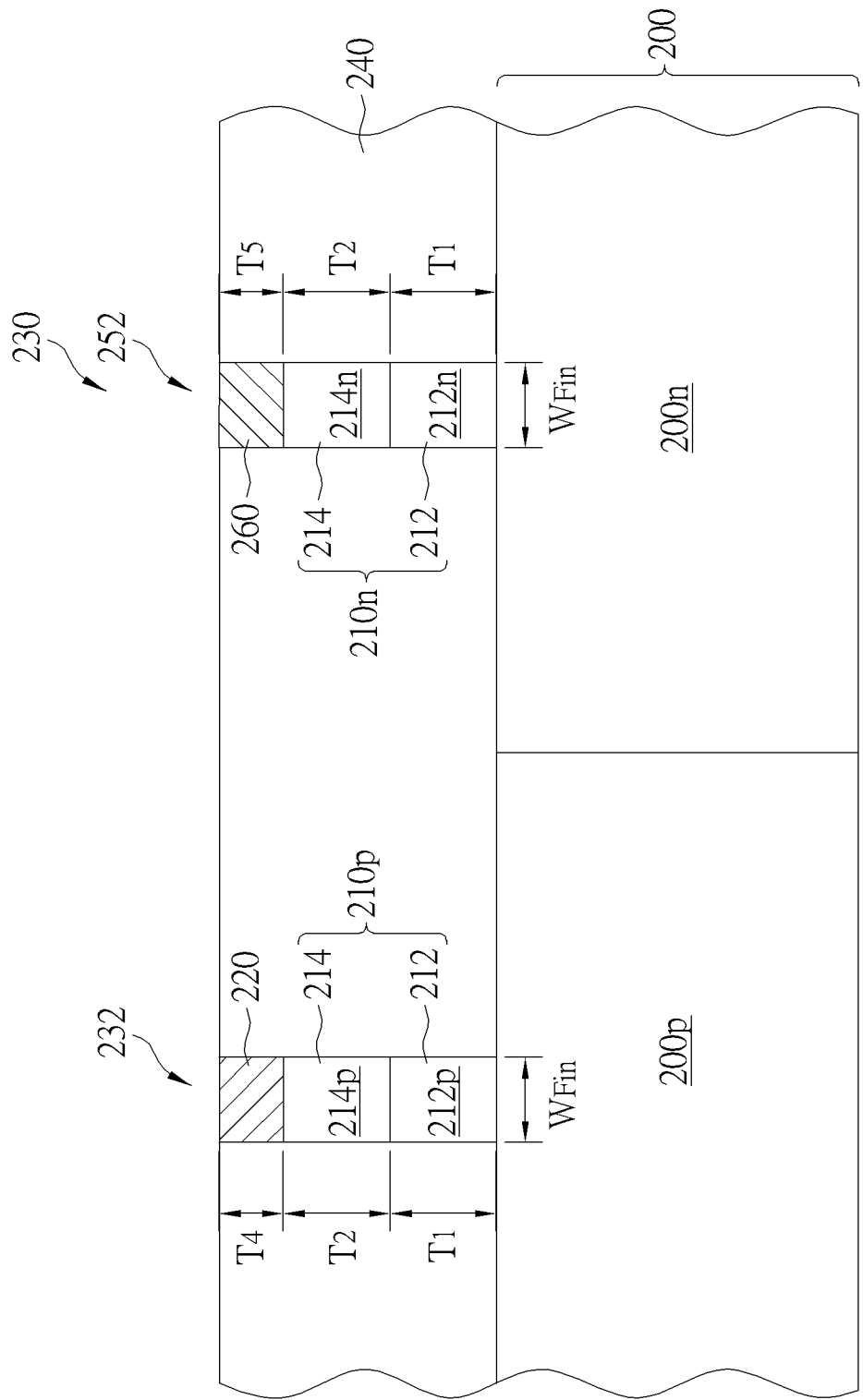

Please refer to FIG. 14. After forming the recess 252, an epitaxial semiconductor layer 260 is formed in the recess 252. The epitaxial semiconductor layer 260 can be formed by a SEG method, but not limited to this. Next, a planarization process is performed to remove superfluous epitaxial material and the patterned hard mask 250, and thus the recess 252 is filled up with the epitaxial semiconductor layer 260. And a surface of the epitaxial semiconductor layer 260, a surface of the dielectric layer 240 and a surface of the epitaxial semiconductor layer 220 are all coplanar. The epitaxial semiconductor layer 260 includes at least the second semiconductor material. As mentioned above, the second semiconductor material is Ge in the preferred embodiment. In some embodiments of the present invention, the epitaxial semiconductor layer 260 can include both of the first semiconductor material and the second semiconductor material. That is, the epitaxial semiconductor layer 260 can include SiGe. It is noteworthy that a concentration of the second semiconductor material in the epitaxial semiconductor layer 260 is larger than the concentration of the second semiconductor material in the second portion (that is the n-typed lower epitaxial layer 212n and the n-typed upper epitaxial layer 214n) of the epitaxial structure 230. It is also noteworthy that the epitaxial semiconductor layer 260 is also an undoped epitaxial layer. In other words, the epitaxial semiconductor layer 260 includes no conductive dopants. Therefore, the epitaxial semiconductor layer 260 is an intrinsic SiGe layer or an intrinsic Ge layer. Furthermore, the epitaxial semiconductor layer 260 includes a thickness $T_5$, and the thickness $T_5$ is equal to the depth D of the recess 252.

Figure 15:
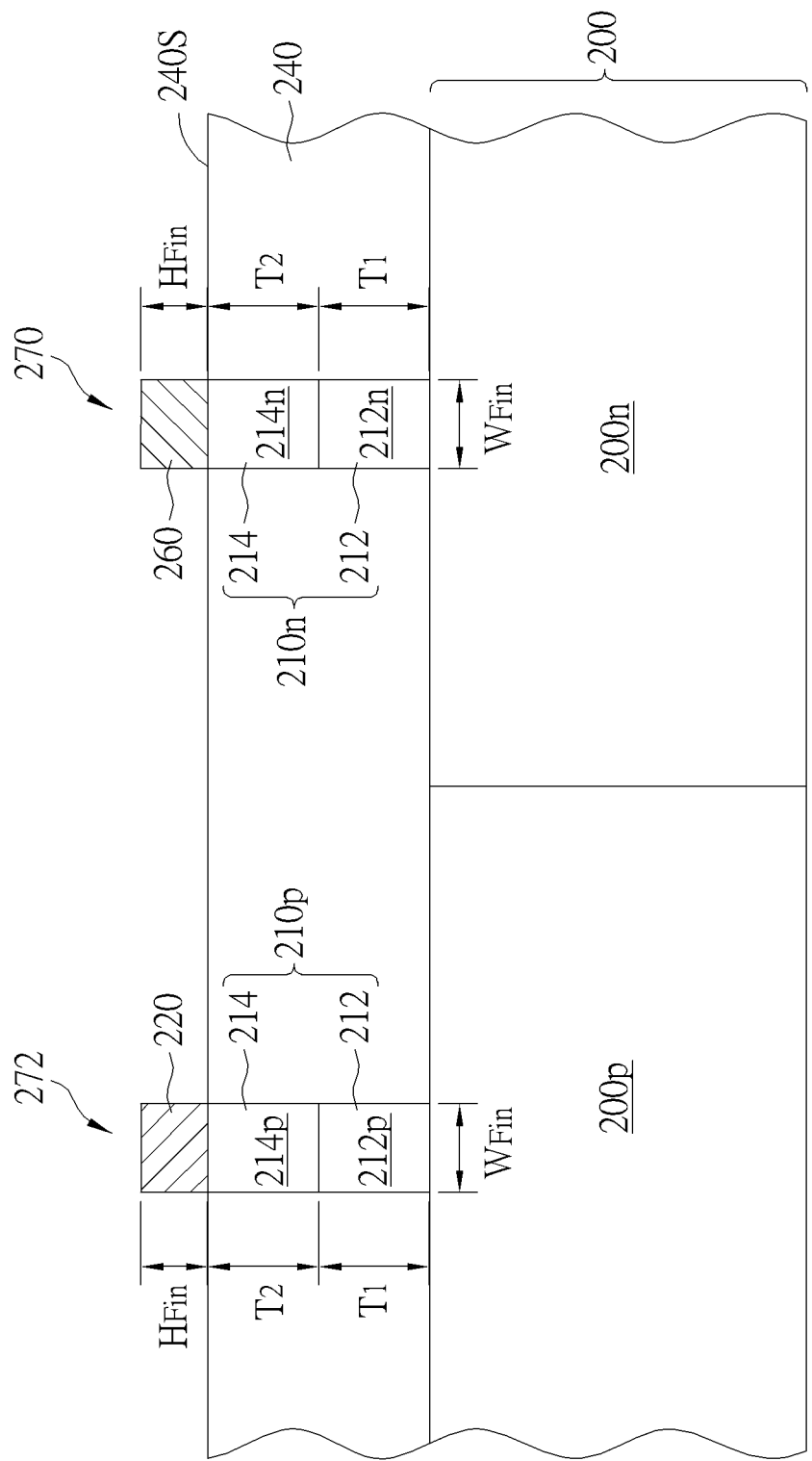

Please refer to FIG. 15. An etching back process is then performed to remove a portion of the dielectric layer 240. Consequently, a portion of or entire epitaxial semiconductor layer 260 and a portion of or entire epitaxial semiconductor layer 220 are protruded from the surface 240S of the dielectric layer 240. Thus, a fin 270 is formed on the n-well 200n, and a fin 272 is formed on the p-well 200p. As shown in FIG. 15, the fins 270/272 are protruded from the surface 240S of the dielectric layer 240, and thus a protruded height is defined between top surfaces of the fins 270/272 and the surface 240S of the dielectric layer 240 according to the preferred embodiment. As mentioned above, the protruded height is defined as fin height $H_{Fin}$. In the preferred embodiment, the fin height $H_{Fin}$ is smaller than or equal to the thickness $T_5$ of the epitaxial semiconductor layer 260, but not limited to this.

Figure 16:
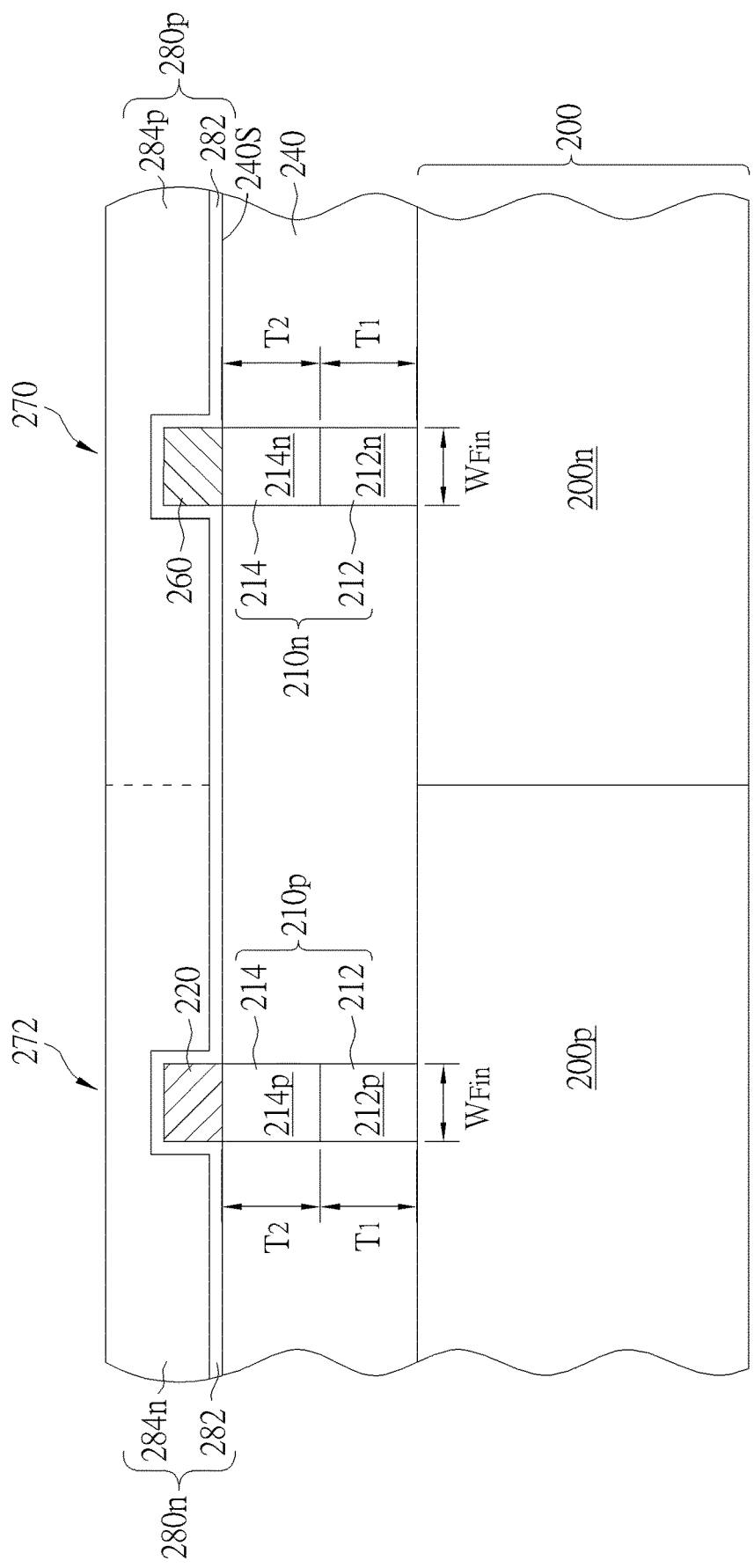

Please refer to FIG. 16. Next, a gate layer is formed on the substrate 200, specifically on the dielectric layer 240 and the fins 270/272. In the preferred embodiment, a p-gate layer 280p is formed on the fin 270 in the n-well 200n, and an n-gate layer 280n is formed on the fin 272 in the p-well 200p. The p-gate layer 280p includes a gate dielectric layer 282 and a p-gate conductive layer 284p, and the n-gate layer 280n includes a gate dielectric layer 282 and an n-gate conductive layer 284n. It is noteworthy that the conductivity types of the gate conductive layers 284p/284n are respectively the same with the conductivity types of the to-be-formed transistors. Therefore the p-gate layer 280p on the n-well 200n is complementary to the n-typed epitaxial semiconductor layer 210n of the fin 270 while the n-gate layer 280n on the p-well 200p is complementary to the p-typed epitaxial semiconductor layer 210p of the fin 272. As shown in FIG. 16, an extending direction of the n/p-gate layers 280n/280p is perpendicular to an extending direction of the fins 270/272. Additionally, the n/p-gate layers 280n/280p covers a portion of tops and sidewalls of the fins 272/270, respectively. Subsequently, steps for forming FinFET are performed. Consequently, a p-FinFET (not shown) is formed on the n-well 200n and an n-FinFET (not shown) is formed on the p-well 200p.

Please still refer to FIG. 16. According to the preferred embodiment, the fin 270 formed on the n-well 200n includes the undoped epitaxial semiconductor layer 260 and the n-typed epitaxial semiconductor layer 210n while the fin 272 formed on the p-well 200p includes the undoped epitaxial semiconductor layer 220 and p-typed epitaxial semiconductor layer 210p. It is noteworthy that though the conductivity types of the n-typed epitaxial semiconductor layer 210n and the p-typed epitaxial semiconductor layer 210p are complementary to each other, Si/Ge ratio (that is the ratio of the first semiconductor material and the second semiconductor material) in the epitaxial semiconductor layers 210n and 210p are identical. In the fin 270, the Si concentration of the epitaxial semiconductor layer 260 is smaller than the Si concentration of the n-typed the epitaxial semiconductor layer 210n. In other words, the Ge concentration of the epitaxial semiconductor layer 260 is larger than the Ge concentration of the n-typed epitaxial semiconductor layer 210n. Consequently, a compressive stress is generated from the epitaxial semiconductor layer 260 to the n-typed epitaxial semiconductor layer 210n, and thus carrier mobility in the channel region of the p-FinFET is improved. Furthermore, since the Ge concentration of the n-typed epitaxial semiconductor layer 210n is between that of the epitaxial semiconductor layer 260 and the substrate 200, the n-typed epitaxial semiconductor layer 210n serves as a SRB layer. Consequently, the growth of the dislocation defects due to lattice mismatch is confined in this SRB layer. In the fin 272, the Si concentration of the epitaxial semiconductor layer 220 is larger than the Si concentration of the p-typed epitaxial semiconductor layer 210p. Therefore a tensile stress is generated from the epitaxial semiconductor layer 220 to the p-typed epitaxial semiconductor layer 210p, and thus carrier mobility in the channel region of the n-FinFET is improved. In addition, the Si concentration of the epitaxial semiconductor layer 220 in the fin 272 is larger than the Si concentration of the epitaxial semiconductor layer 260 in the fin 270. It is also noteworthy that since the n-typed epitaxial semiconductor layer 210n is complementary to the p-FinFET and the p-typed epitaxial semiconductor layer 210p is complementary to the n-FinFET, the n/p-epitaxial semiconductor layers 210n/210p formed under the epitaxial semiconductor layers 260/220 (where the channels are to be formed) respectively serve as an APT layer, and thus punch through effect is avoided.

Figure 17:
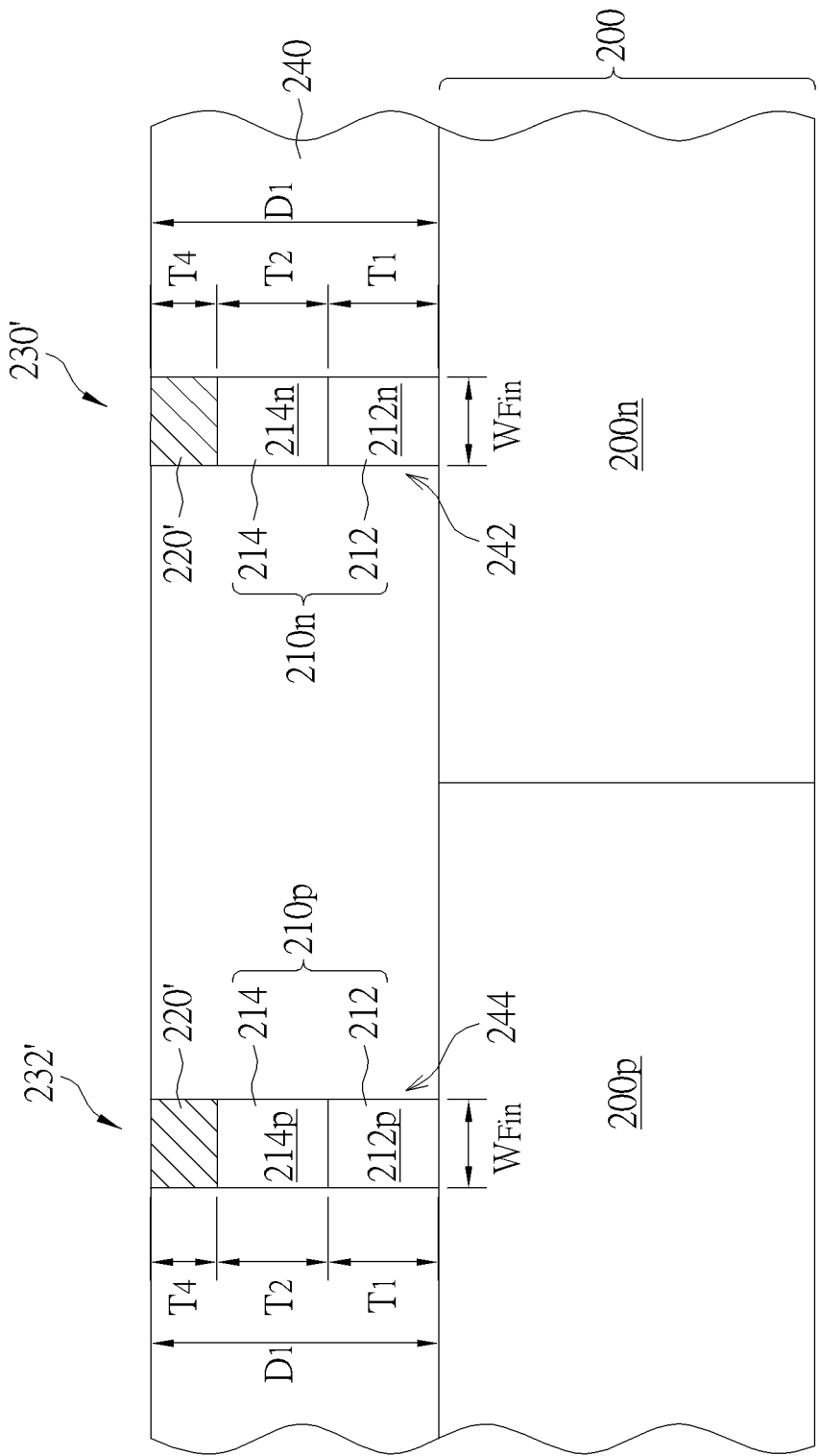

Please refer to FIGS. 17-20, which are schematic drawings illustrating a method for manufacturing fins provided by a fourth preferred embodiment of the present invention. It is noteworthy that elements the same in the fourth and the abovementioned preferred embodiments can include the same materials and formed by the same processes, and thus those details are omitted in the interest of brevity. It should be understood that elements the same in the third and fourth preferred embodiments are designated by the same numerals. As shown in FIG. 17, a substrate 200 is provided according to the preferred embodiment. The substrate 200 includes a first semiconductor material such as Si. And an n-well 200n and a p-well 200p are formed in the substrate 200 as shown in FIG. 17. Then, a dielectric layer 240 is formed on the substrate 200. The dielectric structure 240 can be formed by any suitable process such as STI fabricating process, and thus those details are omitted for simplicity. A dry etching process is then performed to remove the substrate 200 formed in between the STIs 240, and thus a plurality of trenches 242/244 are formed in the dielectric layer 240. It is noteworthy that at least a trench 242 is formed in the dielectric layer 240 on the n-well 200n, and at least a trench 244 is formed in the dielectric layer 240 on the p-well 200p. According to the preferred embodiment, bottoms of the trenches 242/244 are coplanar with a bottom of the dielectric layer 240 as shown in FIG. 17. Furthermore, the trenches 242/244 include a width $W_{Fin}$ and a depth $D_1$. According to the preferred embodiment, the width $W_{Fin}$ of the trenches 242/244 is equal to a width of fins to be formed. In some embodiments of the present invention, the depth $D_1$ of the trenches 242/244 can be between 100 nm and 300 nm, but not limited to this. Additionally, according to a modification to the preferred embodiment, the dry etching process used to remove the substrate 200 in between the dielectric layer 240 can be performed to over-etch the substrate 200.

Therefore, bottoms of the trenches 242/244 are lower than the bottom of the dielectric layer 240.

Please refer to FIG. 17 again. Subsequently, SEG methods, ion implantations, and thermal treatment as mentioned above are performed, and thus an n-typed lower epitaxial layer 212n is formed in the trench 242 on the n-well 200n and a p-typed lower epitaxial layer 212p is formed in the trench 244 on the p-well 200p. As mentioned above, the n/p-typed lower epitaxial layers 212n/212p includes the first semiconductor material and a second semiconductor material, and a lattice constant of the second semiconductor material is different from a lattice constant of the first semiconductor material. In the preferred embodiment, the lattice constant of the second semiconductor material is larger than the lattice constant of the first semiconductor material. For example, the second semiconductor material provided by the preferred embodiment is Ge, but not limited to this.

Pleas still refer to FIG. 17. After forming the n-typed lower epitaxial layer 212n and the p-typed lower epitaxial layer 212p, the SEG methods, the ion implantations, and the thermal treatment as mentioned above are performed, and thus an n-typed upper epitaxial layer 214n is formed on the n-typed lower epitaxial layer 212n and a p-typed upper epitaxial layer 214p is formed on the p-typed lower epitaxial layer 212p. As mentioned above, the n/p-typed upper epitaxial layers 214n/214p also include the first semiconductor material and the second semiconductor material. Thus, the n/p-typed upper epitaxial layers 214n/214p are SiGe epitaxial layers. It is noteworthy that a concentration of the second semiconductor material in the n/p-typed upper epitaxial layers 214n/214p is larger than a concentration of the second semiconductor material in the n/p-typed lower epitaxial layer 212n/212p. As shown in FIG. 17, the n-typed upper and lower epitaxial layers 214n/212n construct an n-typed epitaxial semiconductor layer 210n while the p-typed upper and lower epitaxial layers 214p/212p construct a p-typed epitaxial semiconductor layer 210p.

Please still refer to FIG. 17. After forming the n/p-typed epitaxial semiconductor layers 210n/210p which include both of the first semiconductor material and the second semiconductor material, another epitaxial semiconductor layer 220' is formed on the n/p-typed epitaxial semiconductor layers 210n/210p. And the trenches 242/244 are filled up with the epitaxial semiconductor layer 220'. The epitaxial semiconductor layer 220' can be formed be performing a SEG method, but not limited to this. The epitaxial semiconductor layer 220' includes a thickness $T_4$, and the thickness $T_4$ can be 40 nm, but not limited to this. It is noteworthy that the epitaxial semiconductor layer 220' includes only the second semiconductor material in accordance with the preferred embodiment, therefore the epitaxial semiconductor layer 220' is a Ge epitaxial layer. However, in some embodiments of the present invention, the epitaxial semiconductor layer 220' can include both the first semiconductor material and the second semiconductor material, such as SiGe. It is noteworthy that in those embodiments, a concentration of the second semiconductor material in the epitaxial semiconductor layer 220' is always larger than the concentration of the second semiconductor material in the underneath n/p-typed the upper epitaxial layers 214n/214p. Furthermore, the epitaxial semiconductor layer 220' is an undoped epitaxial layer. In other words, the epitaxial semiconductor layer 220' includes no conductive dopants. Therefore, the epitaxial semiconductor layer 220' is an intrinsic Ge layer or an intrinsic SiGe layer. Accordingly, an epitaxial structure 230' is formed in the dielectric layer 240 on the n-well 200n and an epitaxial structure 232' is formed in the dielectric layer 240 on the p-well 200p. According to the preferred embodiment, the undoped Ge epitaxial layer 220' of the epitaxial structure 230' is taken as a first portion and the n-typed SiGe epitaxial layer 210n (that is the n-typed lower epitaxial layer 212n and the n-typed upper epitaxial layer 214n) is taken as a second portion sandwiched in between the first portion and the substrate 200. In the same concept, the undoped Ge epitaxial layer 220' of the epitaxial structure 232' is taken as the first portion and the p-typed SiGe epitaxial layer 210p (that is the p-typed lower epitaxial layer 212p and the p-typed upper epitaxial layer 214p) is taken as a third portion sandwiched in between the first portion and the substrate 200. It is concluded that the second portion of the patterned epitaxial structure 230' and the third portion of the patterned epitaxial structure 232' include conductivity types complementary to each other.

Figure 18:
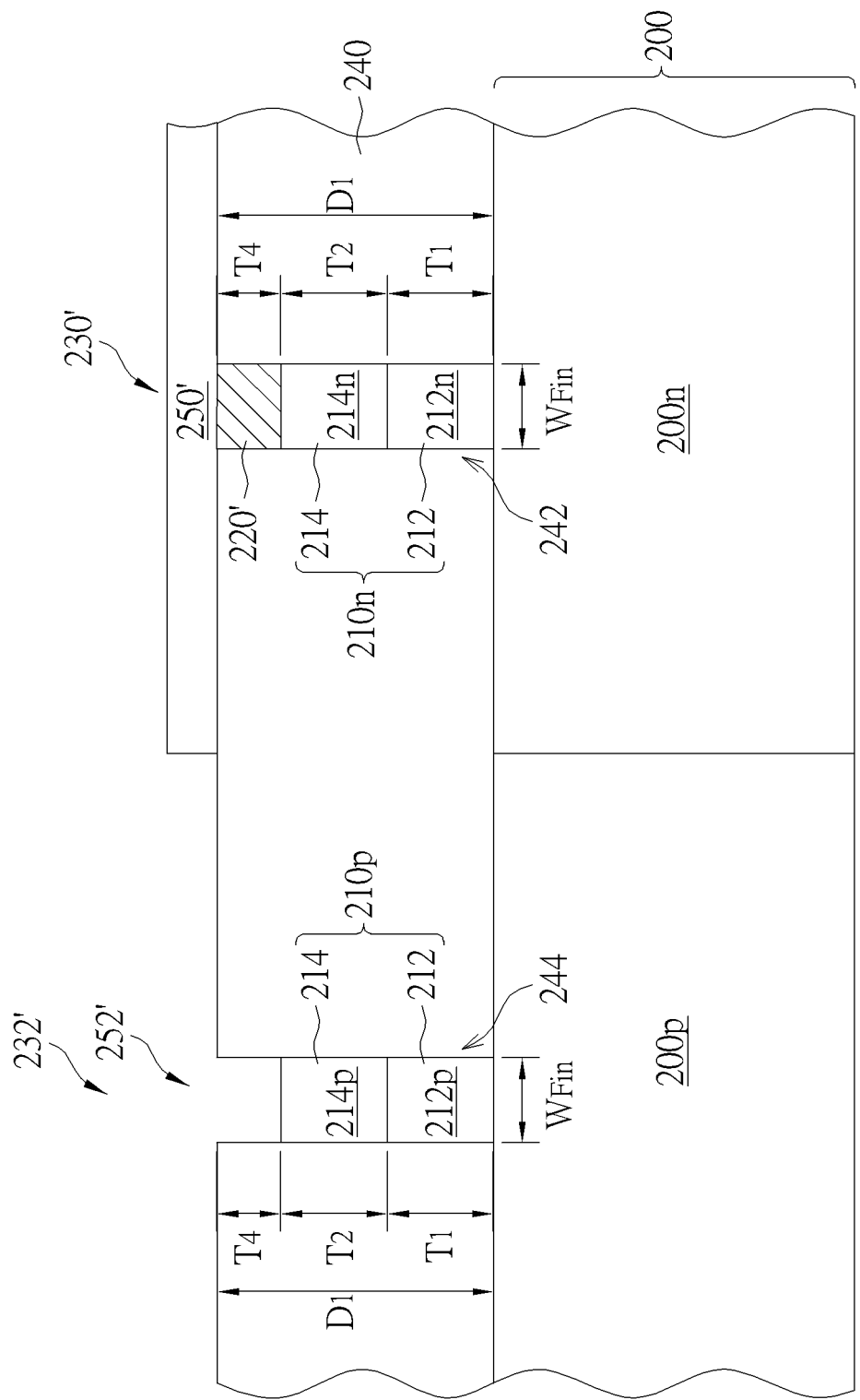

Please refer to FIG. 18. After forming the epitaxial structures 230'/232', a patterned hard mask 250' covering the dielectric layer 240 and the epitaxial structure 230' in the n-well 200n is formed. Next, a suitable etching process is performed to remove a portion of the epitaxial structure 232'. In detail, the etching process is performed to remove the first portion (that is the epitaxial semiconductor layer 220') of the epitaxial structure 232'. Consequently, a recess 252' is formed on the p-well 200p, as shown in FIG. 18.

Figure 19:
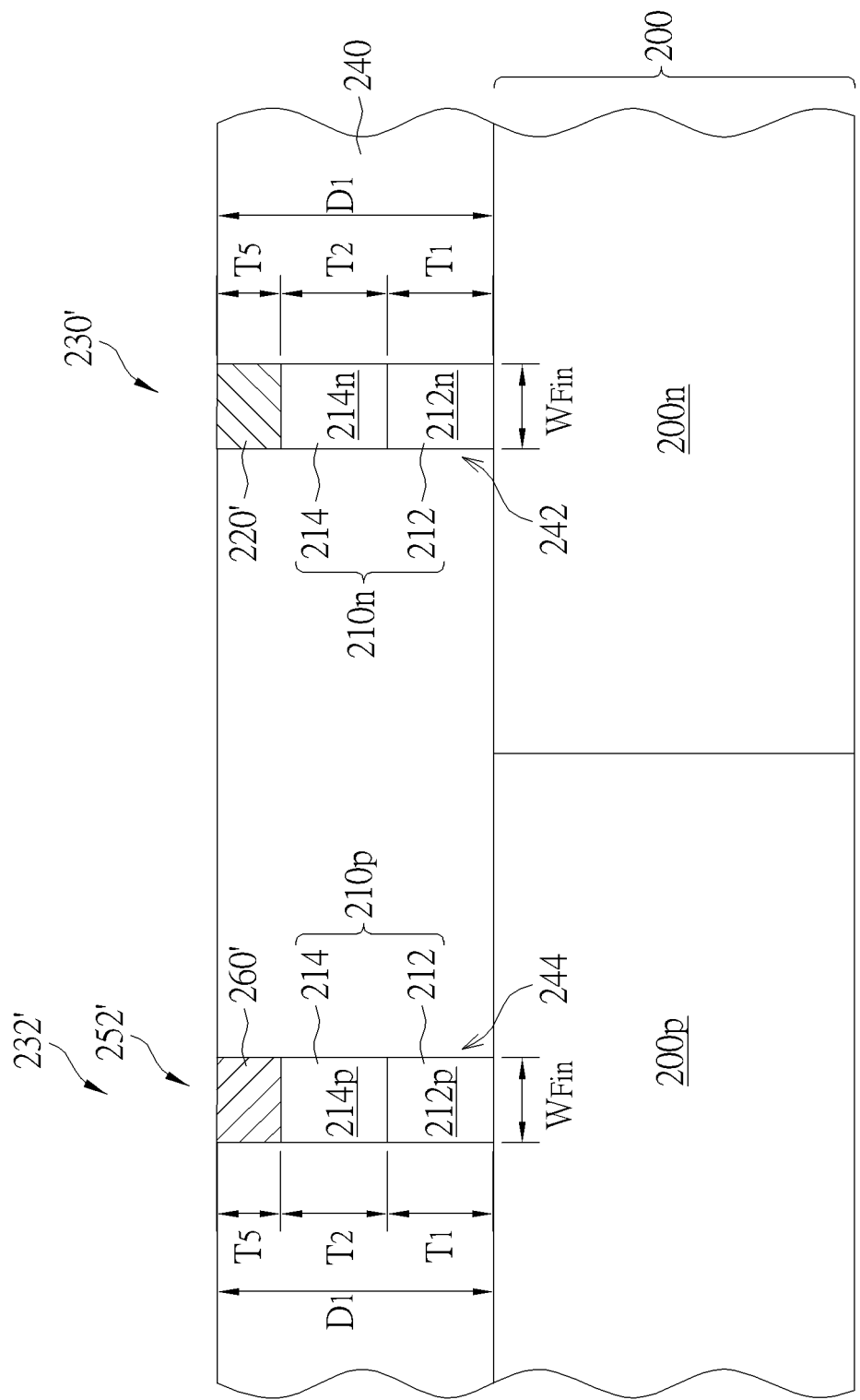

Please refer to FIG. 19. After forming the recess 252', an epitaxial semiconductor layer 260' is formed in the recess 252'. The epitaxial semiconductor layer 260' can be formed by a SEG method, but not limited to this. Next, a planarization process is performed to remove superfluous epitaxial material and the patterned hard mask 250', and thus the recess 252' is filled up with the epitaxial semiconductor layer 260'. And a surface of the epitaxial semiconductor layer 260', a surface of the dielectric layer 240, and a surface of the epitaxial semiconductor layer 220' are all coplanar. It is noteworthy that in the preferred embodiment, the epitaxial semiconductor layer 260' includes only the first semiconductor material. Therefore the epitaxial semiconductor layer 260' is a Si epitaxial layer. It is also noteworthy that the epitaxial semiconductor layer 260' is an undoped epitaxial layer. In other words, the epitaxial semiconductor layer 260' includes no conductive dopants. Therefore, the epitaxial semiconductor layer 260' is an intrinsic Si layer. Furthermore, the epitaxial semiconductor layer 260' includes a thickness $T_5$, and the thickness $T_5$ of the epitaxial semiconductor layer 260' is equal to the depth D of the recess 252'.

Figure 20:
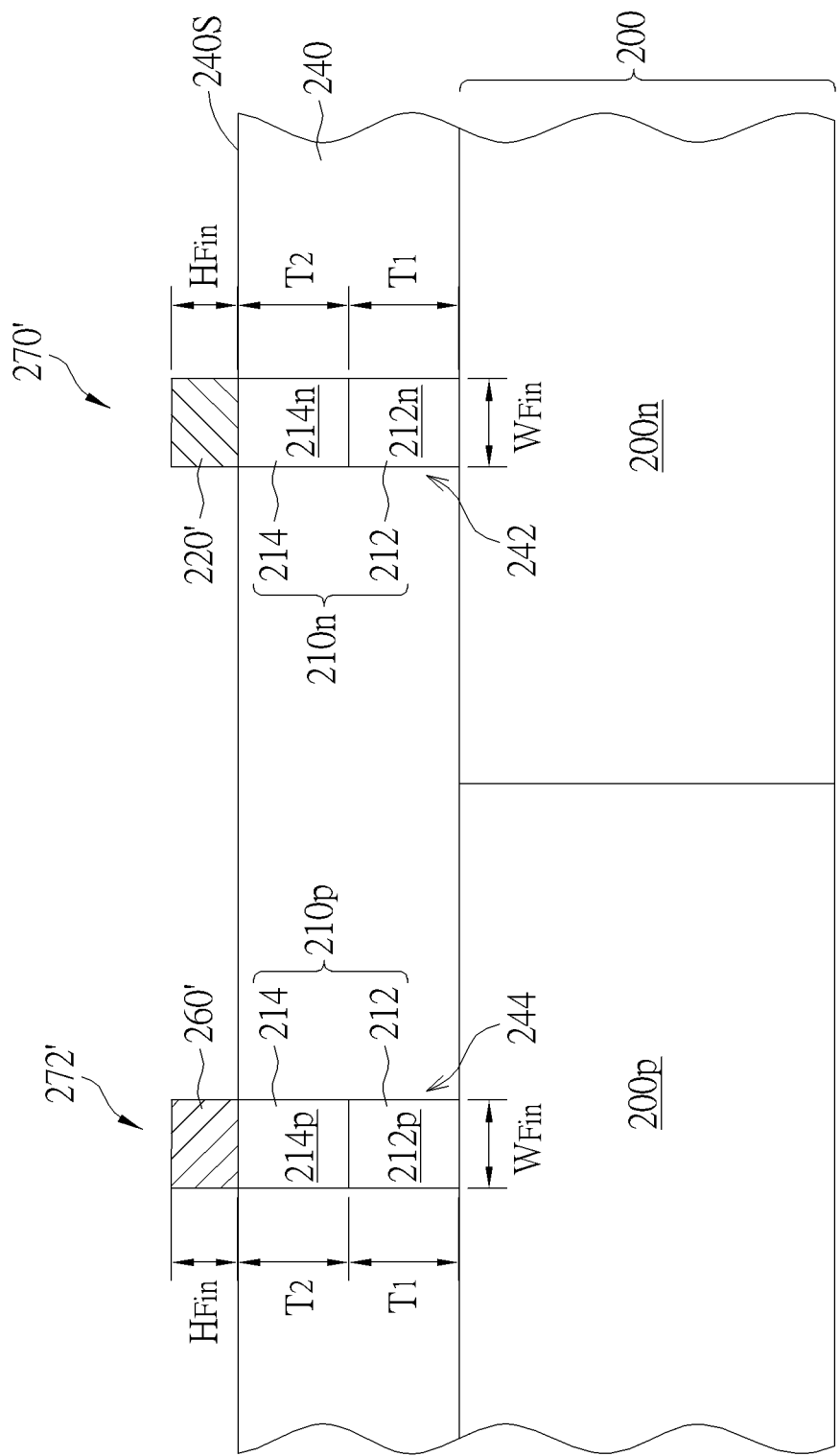

Please refer to FIG. 20. An etching back process is then performed to remove a portion of the dielectric layer 240. Consequently, a portion of or entire epitaxial semiconductor layer 260' and a portion of or entire epitaxial semiconductor layer 220' are protruded from the surface 240S of the dielectric layer 240. Thus, a fin 270' is formed on the n-well 200n, and a fin 272' is formed on the p-well 200p. As shown in FIG. 20, the fins 270'/272' are protruded from the surface 240S of the dielectric layer 240, and thus a protruded height is defined between top surfaces of the fins 270'/272' and the surface 240S of the dielectric layer 240 according to the preferred embodiment. As mentioned above, the protruded height is defined as fin height $H_{Fin}$. In the preferred embodiment, the fin height $H_{Fin}$ is smaller than or equal to the thickness $T_5$ of the epitaxial semiconductor layer 260', but not limited to this.

Next, a gate layer is formed on the substrate 200, specifically on the dielectric layer 240 and the fins 270'/272'. As mentioned above, a p-gate layer (not show) is formed on the fin 270' in the n-well 200n and an n-gate layer (not shown)

is formed on the fin 272' in the p-well 200p. And the p-gate layer includes a gate dielectric layer and a p-gate conductive layer while the n-gate layer includes a gate dielectric layer and an n-gate conductive layer. Subsequently, steps for forming FinFET are performed. Consequently, a p-FinFET (not shown) is formed on the n-well 200n and an n-FinFET (not shown) is formed on the p-well 200p. Since those steps are the same with the first preferred embodiment, those details are omitted in the interest of brevity.

Please still refer to FIG. 20. According to the preferred embodiment, the fin 270' formed on the n-well 200n includes the undoped epitaxial semiconductor layer 260' and the n-typed epitaxial semiconductor layer 210n while the fin 272' formed on the p-well 200p includes the undoped epitaxial semiconductor layer 220' and p-typed epitaxial semiconductor layer 210p. As mentioned above, though the conductivity types of the n-typed epitaxial semiconductor layer 210n and the p-typed epitaxial semiconductor layer 210p are complementary to each other, Si/Ge ratio (that is the ratio of the first semiconductor material and the second semiconductor material) in the n-typed epitaxial semiconductor layers 210n and the p-typed epitaxial semiconductor layer 210p are identical. In the fin 270', the Si concentration of the epitaxial semiconductor layer 220' is smaller than the Si concentration of the n-typed the epitaxial semiconductor layer 210n. In other words, the Ge concentration of the epitaxial semiconductor layer 220' is larger than the Ge concentration of the n-typed epitaxial semiconductor layer 210n. Consequently, a compressive stress is generated from the epitaxial semiconductor layer 220' to the n-typed epitaxial semiconductor layer 210n, and thus carrier mobility in the channel region of the p-FinFET is improved. Furthermore, since the Ge concentration of the n-typed epitaxial semiconductor layer 210n is between that of the epitaxial semiconductor layer 220' and the substrate 200, the n-typed epitaxial semiconductor layer 210n serves as a SRB layer. In the fin 272', the Si concentration of the epitaxial semiconductor layer 260' is larger than the Si concentration of the p-typed epitaxial semiconductor layer 210p. Therefore a tensile stress is generated from the epitaxial semiconductor layer 260' to the p-typed epitaxial semiconductor layer 210p, and thus carrier mobility in the channel region of the n-FinFET is improved. It is also noteworthy that since the n-typed epitaxial semiconductor layer 210n is complementary to the p-FinFET, and the p-typed epitaxial semiconductor layer 210p is complementary to the n-FinFET, the n-typed epitaxial semiconductor layers 210n formed under the epitaxial semiconductor layer 220' (where the channel is to be formed) and the p-typed epitaxial semiconductor layer 210p formed under the epitaxial semiconductor layer 220' (where the channel is to be formed) respectively serve as an APT layer, and thus punch through effect is avoided.

According to the third and fourth preferred embodiments mentioned above, it is concluded that the present invention provides a replacement fin process integrated with STI-first approach: a portion of the epitaxial structure is removed and replaced with another epitaxial layer. Thus the resulted fins are able to render the tensile or the compressive stresses due to the different materials/concentrations. In other words, different stressors and different channels required by transistors including complementary conductivity types are formed by the manufacturing method provided by the present invention.

Briefly speaking, according to the semiconductor device and the manufacturing method provided by the present invention, a replacement fin approach is provided: By removing a portion of the first epitaxial structure/the first patterned epitaxial structure and forming different epitaxial structures, the resulted fins respectively render the tensile and compressive stresses due to the different materials/ concentrations. In other words, different stressors required by transistors including complementary conductivity types are formed by the manufacturing method provided by the present invention. Furthermore, the semiconductor device and the manufacturing method provided by the present invention can be integrated with the STI-first process and the STI-last process. That is, process flexibility and process practicability of the method provided by the present invention are both improved. Additionally, the method for manufacturing fins provided by the present invention further is able to for SRB layer for confining the dislocation defects and the ATP layer for avoiding punch through effect, and thus performances of the resulted transistors is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
    a substrate comprising a first semiconductor material;
    a first well formed in the substrate, the first well comprising a first conductivity type;
    a second well formed in the substrate, the second well comprising a second conductivity type, and the first conductivity type and the second conductivity type being complementary to each other;
    a plurality first fins formed over the first well, each of the first fins comprising the first semiconductor material and a second semiconductor material, a lattice constant of the second semiconductor material being larger than a lattice constant of the first semiconductor material, and the first semiconductor material in each of the first fins comprising a first concentration;
    a plurality of second fins formed over the second well, each of the second fins comprising the first semiconductor material and the second semiconductor material, the first semiconductor material in each of the second fins comprising a second concentration, and the second concentration being larger than the first concentration; and
    a dummy fin disposed above the substrate, wherein the dummy fin comprises one of the first fins and one of the second fins, the first fin in the dummy fin and the second fin in the dummy fin directly contact each other and are disposed side by side.

2. The semiconductor device according to claim 1, further comprising a first semiconductor layer and a second semiconductor layer, the first semiconductor layer being sandwiched in between one of the first fins and the substrate, and the second semiconductor layer being sandwiched in between one of the second fins and the substrate.

3. The semiconductor device according to claim 2, wherein the first semiconductor layer comprises the first semiconductor material, the first semiconductor material in the first semiconductor layer comprises a third concentration, and the third concentration is larger than the first concentration.

4. The semiconductor device according to claim 3, wherein the second semiconductor layer comprises the first semiconductor material, the first semiconductor material in the second semiconductor layer comprises a fourth concentration, and the fourth concentration is smaller than the second concentration.

5. The semiconductor device according to claim 4, wherein the third concentration is equal to the fourth concentration.

6. The semiconductor device according to claim 2, wherein the first semiconductor layer comprises the first conductivity type and the second semiconductor layer comprises the second conductivity type.

7. The semiconductor device according to claim 6, further comprising a first gate layer formed on one of the first fins and a second gate layer formed on one of the second fins, the first gate layer comprising the second conductivity type, and the second gate layer comprising the first conductivity type.

8. The semiconductor device according to claim 2, wherein the first semiconductor layer and the second semiconductor layer comprise a single layer or a multiple layer, respectively.

9. A semiconductor device comprising:
- a substrate comprising a first semiconductor material;
- a first well formed in the substrate, the first well comprising a first conductivity type;
- a second well formed in the substrate, the second well comprising a second conductivity type, and the first conductivity type and the second conductivity type being complementary to each other;
- a plurality first fins formed on the first well, each of the first fins comprising the first semiconductor material and a second semiconductor material, a lattice constant of the second semiconductor material being larger than a lattice constant of the first semiconductor material, and the first semiconductor material in each of the first fins comprising a first concentration;
- a plurality of second fins formed on the second well, each of the second fins comprising the first semiconductor material and the second semiconductor material, the first semiconductor material in each of the second fins comprising a second concentration, and the second concentration being larger than the first concentration; and
- a semiconductor layer being sandwiched in between one of the first fins and the substrate, the semiconductor layer comprising an upper epitaxial layer and a lower epitaxial layer, wherein the upper epitaxial layer comprises the first semiconductor material and the second semiconductor material, the lower epitaxial layer comprises the first semiconductor material and the second semiconductor material, a concentration of the second semiconductor material in the upper epitaxial layer is larger than a concentration of the second semiconductor material in the lower epitaxial layer, and a concentration of the second semiconductor material in each of the first fins is larger than the concentration of the second semiconductor material in the upper epitaxial layer.

* * * * *